(12) United States Patent
Peng et al.

(10) Patent No.: US 11,728,269 B2
(45) Date of Patent: *Aug. 15, 2023

(54) SEMICONDUCTOR DEVICE, AND ASSOCIATED METHOD AND SYSTEM

(71) Applicant: TAIWAN SEMICONDUCTOR MANUFACTURING COMPANY LTD., Hsinchu (TW)

(72) Inventors: Shih-Wei Peng, Hsinchu (TW); Wei-Cheng Lin, Taichung (TW); Jiann-Tyng Tzeng, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/721,734

(22) Filed: Apr. 15, 2022

(65) Prior Publication Data
US 2022/0238443 A1    Jul. 28, 2022

Related U.S. Application Data

(63) Continuation of application No. 16/849,985, filed on Apr. 15, 2020, now Pat. No. 11,309,247.

(60) Provisional application No. 62/928,802, filed on Oct. 31, 2019.

(51) Int. Cl.
*H01L 23/528* (2006.01)
*H01L 21/8234* (2006.01)
*H01L 23/522* (2006.01)
*H01L 27/088* (2006.01)

(52) U.S. Cl.
CPC .. *H01L 23/5286* (2013.01); *H01L 21/823475* (2013.01); *H01L 23/5226* (2013.01); *H01L 27/0886* (2013.01)

(58) Field of Classification Search
None
See application file for complete search history.

(56) References Cited

U.S. PATENT DOCUMENTS 11,309,247 B2 * 4/2022 Peng ............... H01L 21/823475
2019/0164882 A1 * 5/2019 Chen .................... H01L 21/743

* cited by examiner

*Primary Examiner* — Hsien Ming Lee
(74) *Attorney, Agent, or Firm* — WPAT Law; Anthony King

(57) ABSTRACT

A semiconductor device, including: a transistor layer, a dielectric layer, a conductive strip and a power grid structure. The transistor layer includes a first active region configured to be a source/drain terminal of a first transistor and a second active region configured to be a source/drain terminal of a second transistor. The bottom surface of the dielectric layer is in direct contact with top surfaces of the source/drain terminals of the first and second transistors. The conductive strip is included in the dielectric layer and extends from the first active region toward the second active region for signal connection. The power grid structure is arranged to direct a power source to the transistor layer from a bottom of the transistor layer.

20 Claims, 26 Drawing Sheets

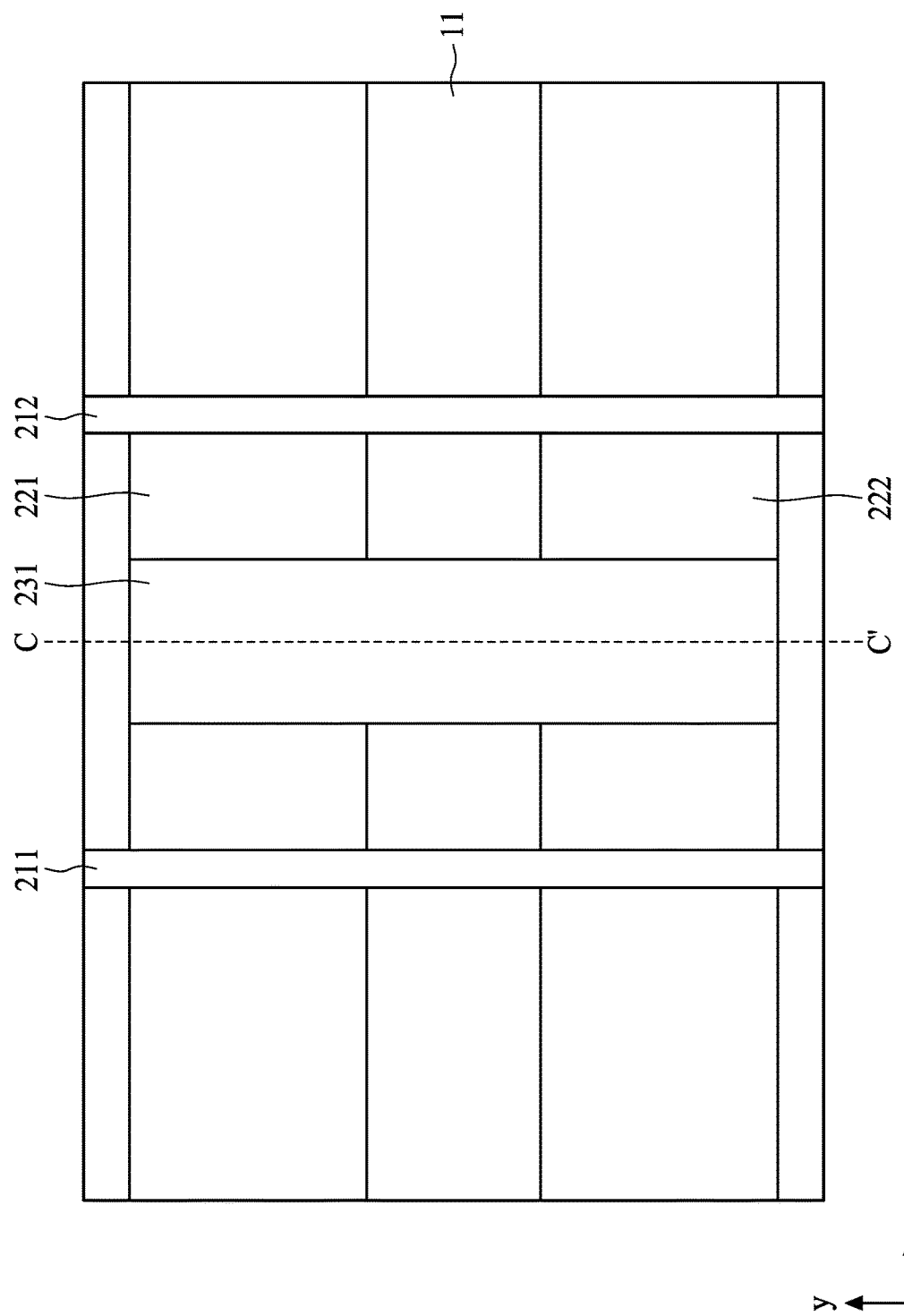

SEMICONDUCTOR DEVICE, AND ASSOCIATED METHOD AND SYSTEM

CROSS-REFERENCE TO RELATED APPLICATION

This application is a continuation of U.S. application Ser. No. 16/849,985, filed on Apr. 15, 2020, which claims the benefit of U.S. Provisional Application No. 62/928,802, filed on Oct. 31, 2019, which is incorporated by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. With such small size, the space for metal routing is inevitably insufficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B are diagrams illustrating a cell in accordance with a first embodiment of the present disclosure.

DETAILED DESCRIPTION

Figure 1A:
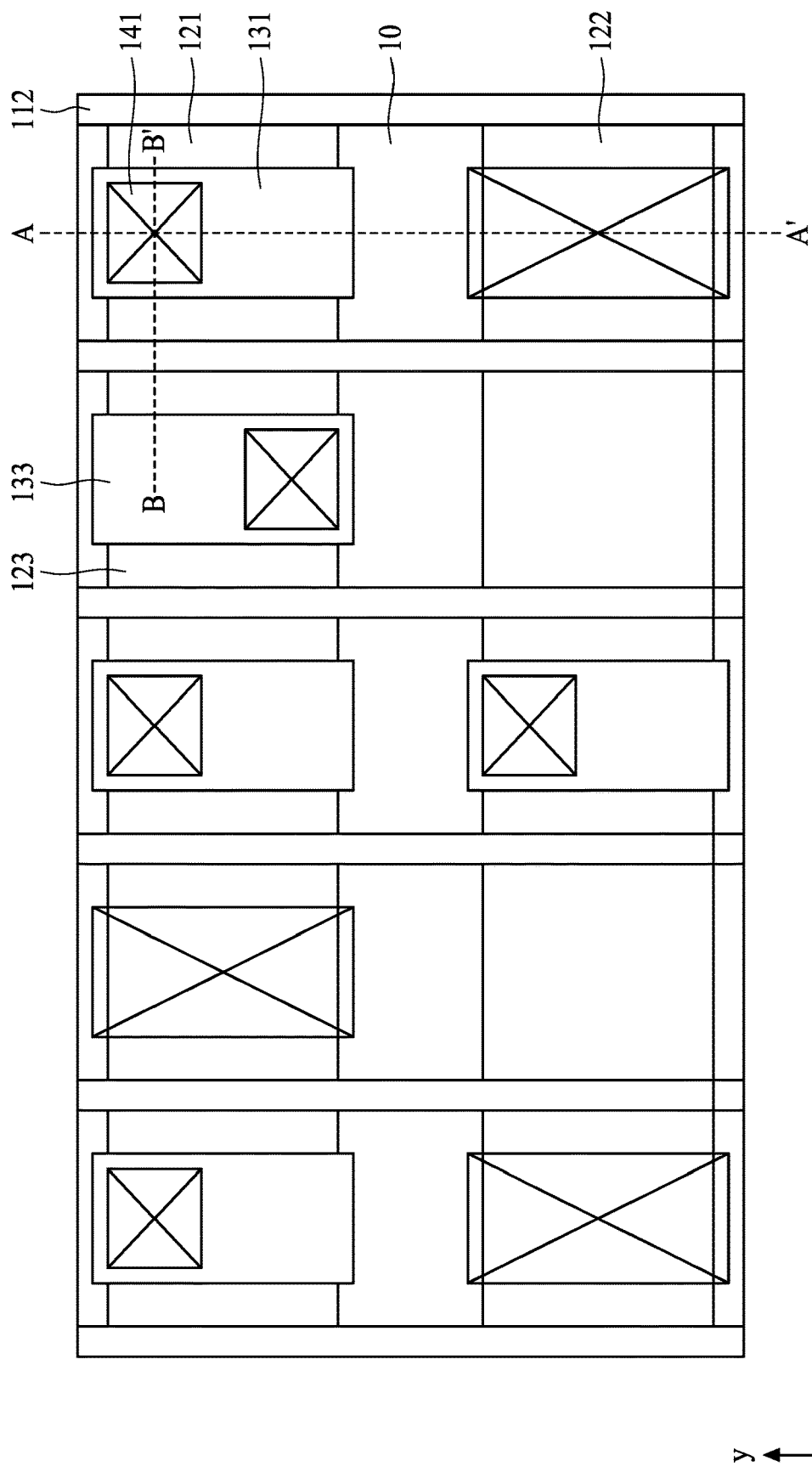
FIGS. 1A to 1C are diagrams illustrating a cell in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As technology progresses, the desire to create smaller integrated circuit (IC) devices increases. One strategy that has been employed includes the use of multi-gate transistors, otherwise known as FinFETs. A typical FinFET device is fabricated using a silicon fin raised from the semiconductor substrate. The channel of the device is formed in the fin, and a gate is provided over (e.g., surrounding) the fin and, for example, in contact with the top and the sidewalls of the fin. The gate surrounding the channel (e.g., fin) is beneficial in that such configuration allows control of the channel from three sides. Besides FinFET structures, the Gate-All-Around (GAA) structure are also widely employed to create a smaller IC.

Another strategy that has been employed includes the use of backside power rail. A typical semiconductor device using backside power rail has one or more conductive rails which may be situated under a semiconductor substrate and electrically connected to source regions, gate regions and/or drain regions of the semiconductor device.

The semiconductor devices that utilize aforementioned FinFET technology, GAA technology and backside power rail technology have successfully decreased the size. However, with such small size, the source of metal routing for signal connection thereof is inevitably insufficient. Therefore, the present disclosure proposes a semiconductor device, a method of manufacturing the semiconductor device and a system including the semiconductor device to solve the problem.

Figure 1B:
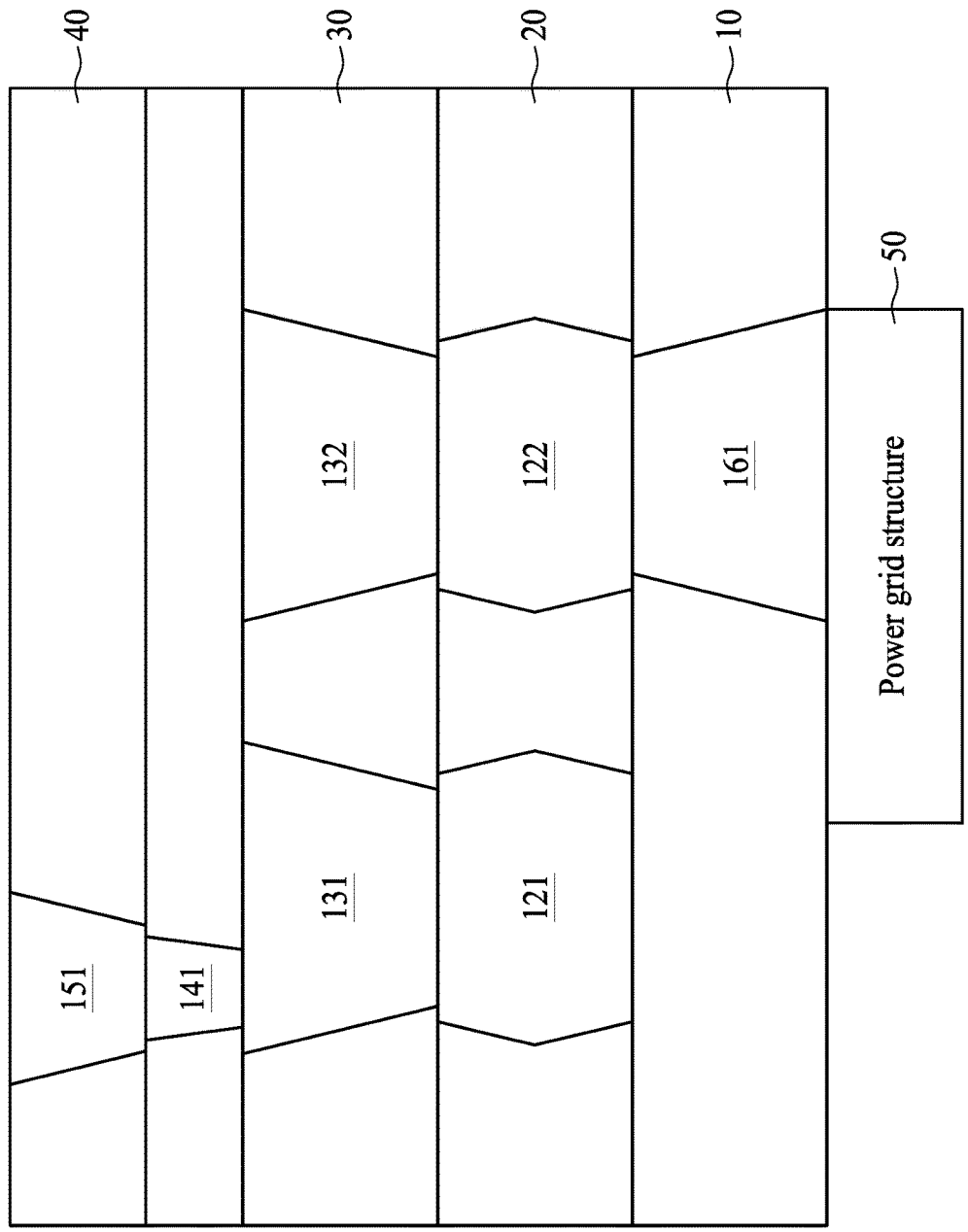
Figure 1C:
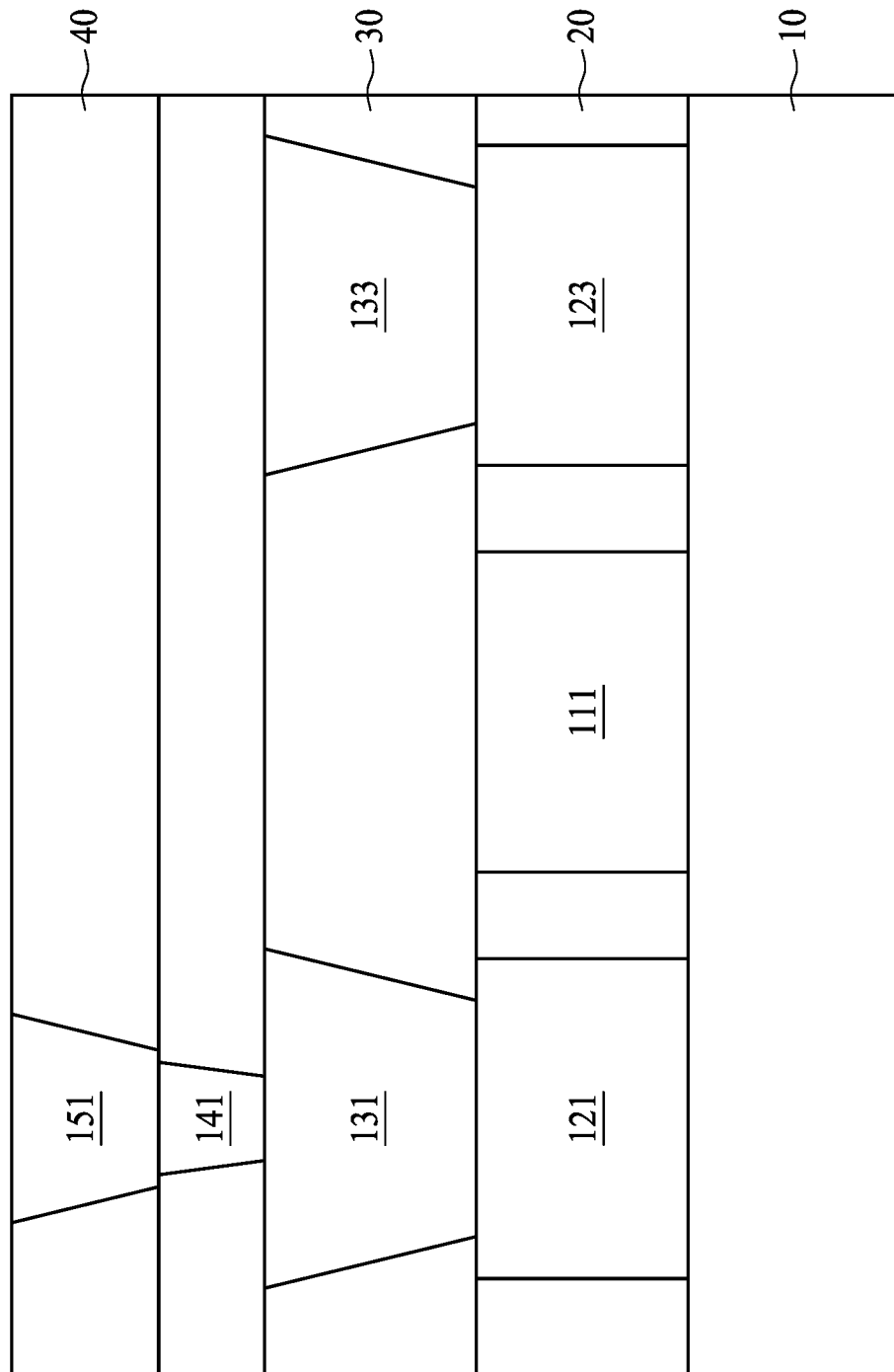

FIGS. 1A to 1C are diagrams illustrating a cell 1 in accordance with an embodiment of the present disclosure. FIG. 1A is a schematic top view. FIG. 1B is a cross-sectional view taken along line A-A' in FIG. 1A. FIG. 1C is a cross-sectional view taken along line B-B' in FIG. 1A. In this embodiment, the cell 1 is a part of a semiconductor device utilizing aforementioned FinFET technology and backside power rail technology. However, this is not a limitation of the present disclosure. In other embodiments, the cell 1 is a part of a semiconductor device utilizing aforementioned GAA technology and backside power tail technology.

The cell 1 includes a substrate 10. In an embodiment, the substrate 10 includes a silicon substrate. Other elementary semiconductors such as germanium and diamond may also be included. Alternatively, the substrate 10 may include a compound semiconductor such as, silicon carbide, gallium arsenide, indium arsenide, or indium phosphide. Further, the substrate 10 may optionally include a silicon-on insulator (SOI) structure.

Moreover, the cell 1 further includes a transistor layer 20 on a first side of the substrate 10. The transistor layer 20 includes active regions where one or more transistors are formed. For example, the transistor layer 20 includes the gate regions 111 and 112 for depositing a poly gate material to form the gate terminals of transistors, and the source/drain regions 121, 122 and 123 include epitaxial silicon, epitaxial silicon germanium, and/or other suitable epitaxial materials to form the source/drain terminals of transistors.

In addition, the cell 1 further includes a dielectric layer 30 on the transistor layer 20. The dielectric layer 30 includes conductive segments formed on the active regions. The conductive segments on the source/drain regions are referred to herein as MD. For example, the dielectric layer 30 includes an MD 131 on the source/drain region 121, an MD 132 on the source/drain region 122, and an MD 133 on the source/drain region 123.

Furthermore, the cell 1 further includes a plurality of metal strips in a first metal layer 40, which is referred to herein as MO layer 40. For example, the cell 1 includes a metal strip 151 above the MD 131. In order to transfer signals from the MDs to the metal strips, contact vias between the dielectric layer 30 and the MO layer 40 in the cell 1 are provided. For example, the cell 1 includes a contact via 141 connected between the MD 131 and the metal strip 151

The cell 1 further includes a power grid structure 50 on a second side of the substrate 10. The power grid structure 50 is arranged to direct power to the transistor layer 20. Specifically, the power grid structure 50 directs the power to the source/drain region 122 via a contact via 161 penetrating through the substrate 10.

As shown in FIG. 1B, since the power grid structure 50 is formed on the backside of the substrate 10, power is directed to the source/drain region 122 from the backside of the substrate 10 instead of the top of the source/drain region 122. Therefore, the source of metal routings for signal connection above the source/drain region 122 can be released. For example, the MD 132 above the source/drain region 122 can be released for signal connection.

Figure 2A:
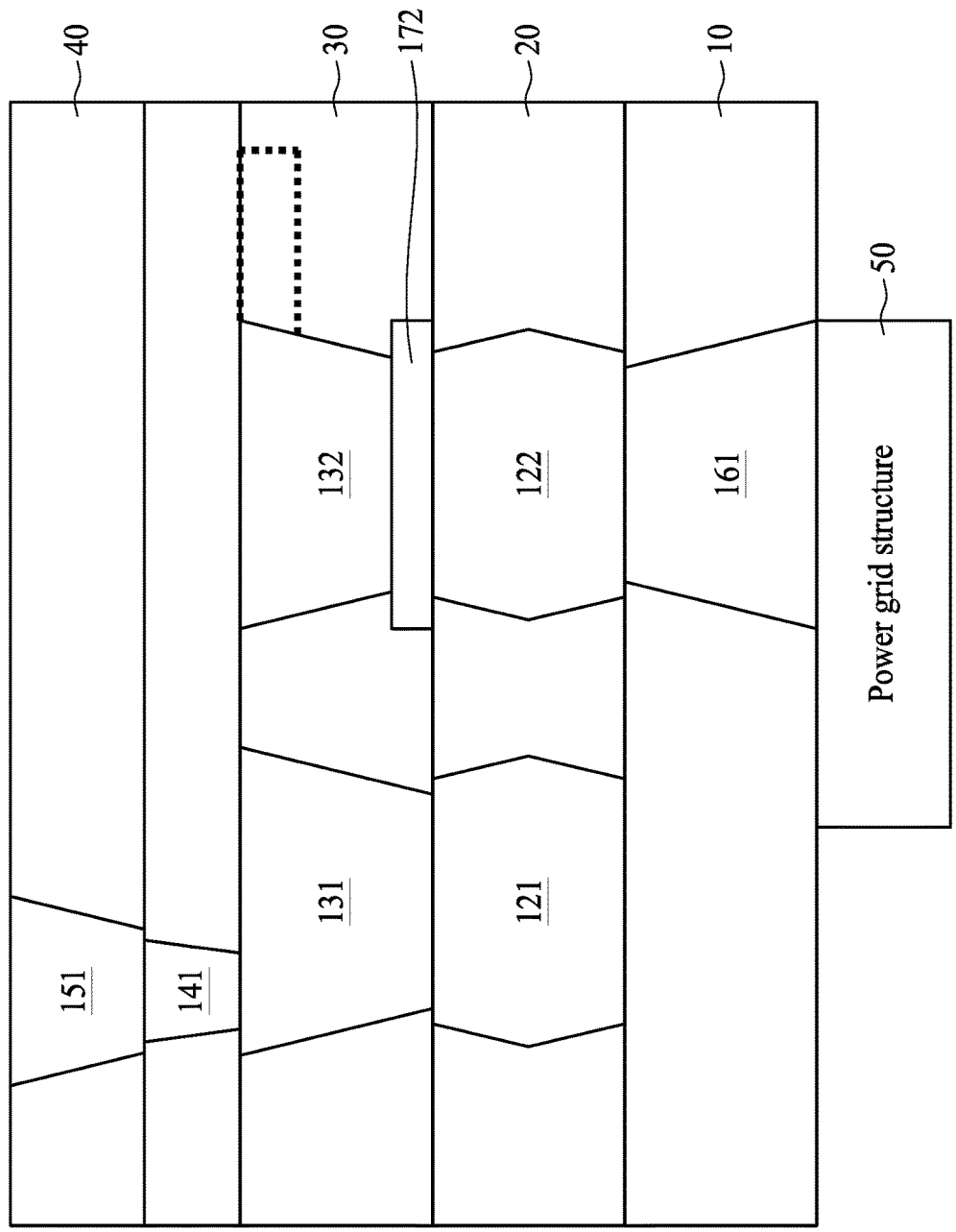
FIGS. 2A and 2B are diagrams illustrating an isolation layer in accordance with an embodiment of the present disclosure.

To utilize the MD 132 for signal connection, an isolation layer is required to isolate the MD 132 from the source/drain region 122. Refer to FIG. 2A, which is a diagram illustrating a cell 2 in accordance with an embodiment of the present disclosure. The cell 2 is similar to the cell 1 in FIGS. 1A to 1C except that the cell 2 further includes an isolation layer 172 between the source/drain region 122 and the MD 132. With the isolation layer 172, the MD 132 can be utilized for signal connection. For example, the MD 132 can further extend in the y direction for signal connection.

However, the location of the isolation layer 172 is not a limitation of the present disclosure as long as the isolation layer 172 can isolate the MD 132 from the source/drain region 122 for signal connection.

Figure 2B:
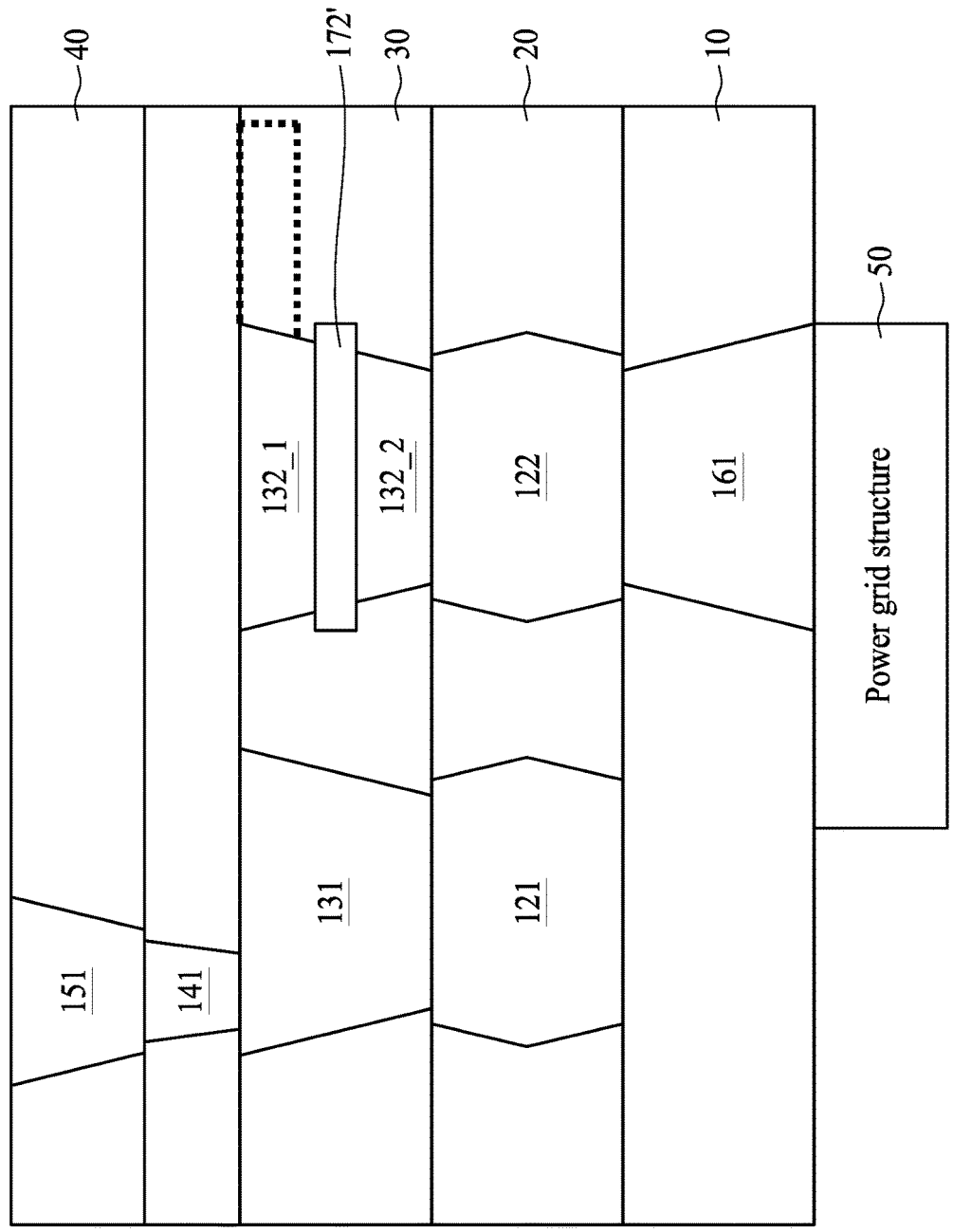

Refer to FIG. 2B, which is a diagram illustrating a cell 2' in accordance with an embodiment of the present disclosure. The cell 2' is similar to the cell 2 except the location of the isolation layer. Specifically, the cell 2' includes an isolation layer 172' which is located between the MD 132 and divides the MD 132 into an upper MD 132_1 and a lower MD 132_2. The upper MD 132_1 can be utilized for signal connection accordingly. For example, the upper MD 132_1 can further extend in the y direction for signal connection.

From the aforementioned embodiments, the semiconductor device can use the MD for signal connection and thus provides an additional resource for signal connection. The following paragraphs describe the exemplary embodiments of utilizing the MD for signal connection.

Figure 3B:
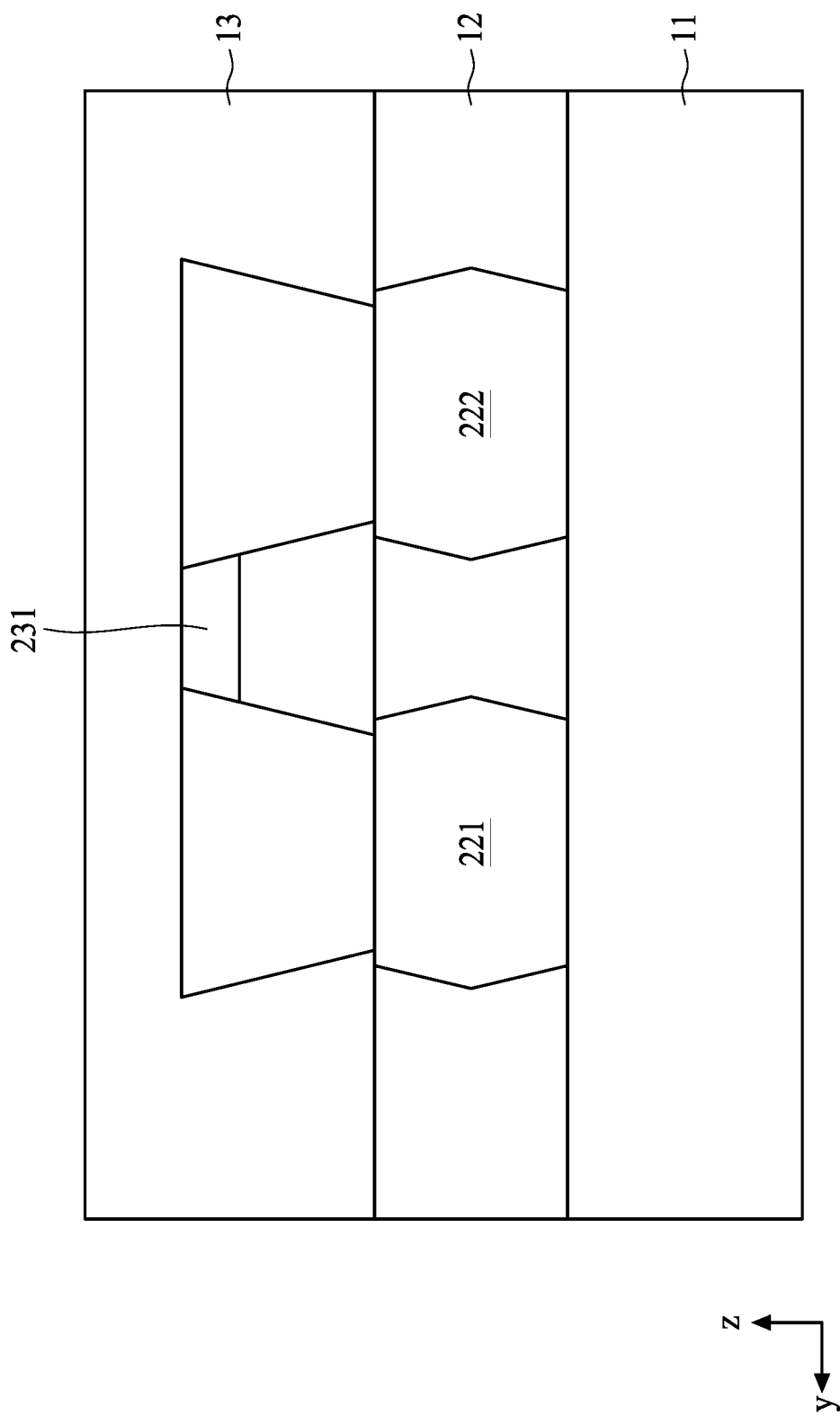

FIGS. 3A and 3B are diagrams illustrating a cell 3 in accordance with a first embodiment of the present disclosure. FIG. 3A is a schematic top view, and FIG. 3B is a cross-sectional view taken along line C-C' in FIG. 3A.

The cell 3 includes a substrate 11. In an embodiment, the substrate 11 includes a silicon substrate. Other elementary semiconductors such as germanium and diamond may also be included. Alternatively, the substrate 11 may include a compound semiconductor such as, silicon carbide, gallium arsenide, indium arsenide, or indium phosphide. Further, the substrate 11 may optionally include an SOI structure.

Moreover, the cell 3 further includes a transistor layer 12 on a first side of the substrate 11. The transistor layer 12 includes active regions where one or more transistors are formed. For example, the transistor layer 12 includes the gate regions 211 and 212 for depositing a poly gate material to form the gate terminals of transistors, and the source/drain regions 221 and 222 include epitaxial silicon, epitaxial silicon germanium, and/or other suitable epitaxial materials to form the source/drain terminals of transistors.

In addition, the cell 3 further includes a dielectric layer 13 on the transistor layer 12. The dielectric layer 13 includes conductive strips formed on the active regions as the MD mentioned above. For example, dielectric layer 13 includes a conductive strip 231 formed on the source/drain region 221 and extending toward the source/drain region 222. More specifically, the conductive strip 231 is connected between the source/drain regions 221 and 222 for signal connection.

In the embodiments of FIGS. 3A and 3B, the conductive strip 231 is arranged to transfer signals between the source/drain regions 221 and 222. Therefore, there is no isolation layer between the conductive strip 231 and the source/drain region 221 (or 222). With such configurations, the conductive strip 231 bridges between the source/drain regions 221 and 222.

Figure 4:
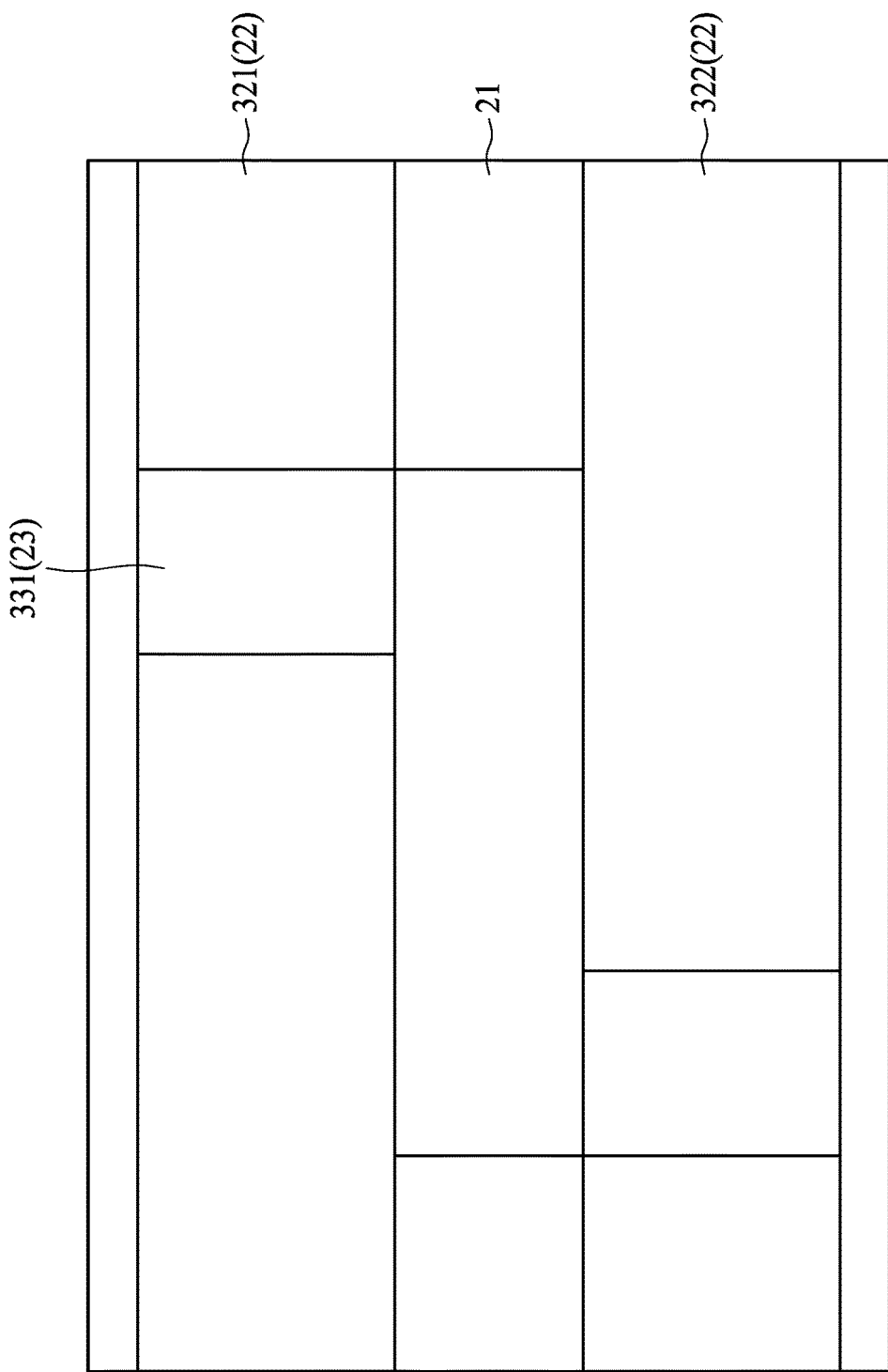
FIG. 4 is a diagram illustrating a cell in accordance with a second embodiment of the present disclosure.

In the embodiments of FIGS. 3A and 3B, the conductive strip 231 is configured to be a straight strip. However, this is not limitation of the present disclosure. FIG. 4 is a diagram illustrating a cell 4 in accordance with a second embodiment of the present disclosure. The cell 4 includes a substrate 21. In an embodiment, the substrate 21 includes a silicon substrate. Other elementary semiconductors such as germanium and diamond may also be included. Alternatively, the substrate 21 may include a compound semiconductor such as, silicon carbide, gallium arsenide, indium arsenide, or indium phosphide. Further, the substrate 21 may optionally include an SOI structure.

Moreover, the cell 4 further includes a transistor layer 22 on a first side of the substrate 21. The transistor layer 22 includes active regions where one or more transistors are formed. For example, the transistor layer 22 includes the gate regions (not shown in FIG. 4) for depositing a poly gate material to form the gate terminals of transistors, and the source/drain regions 321 and 322 include epitaxial silicon, epitaxial silicon germanium, and/or other suitable epitaxial materials to form the source/drain terminals of transistors.

In addition, the cell 4 further includes a dielectric layer 23 on the transistor layer 22. The dielectric layer 23 includes conductive strips formed on the active regions as the MD mentioned above. For example, dielectric layer 23 includes a conductive strip 331 formed on the source/drain region 321 and extending toward the source/drain region 322. More specifically, the conductive strip 231 is connected between the source/drain regions 321 and 322 for signal connection. In this embodiment, the conductive strip 331 routes through two corners between the source/drain regions 321 and 322, which provides more flexibility in signal connection.

Figure 5A:
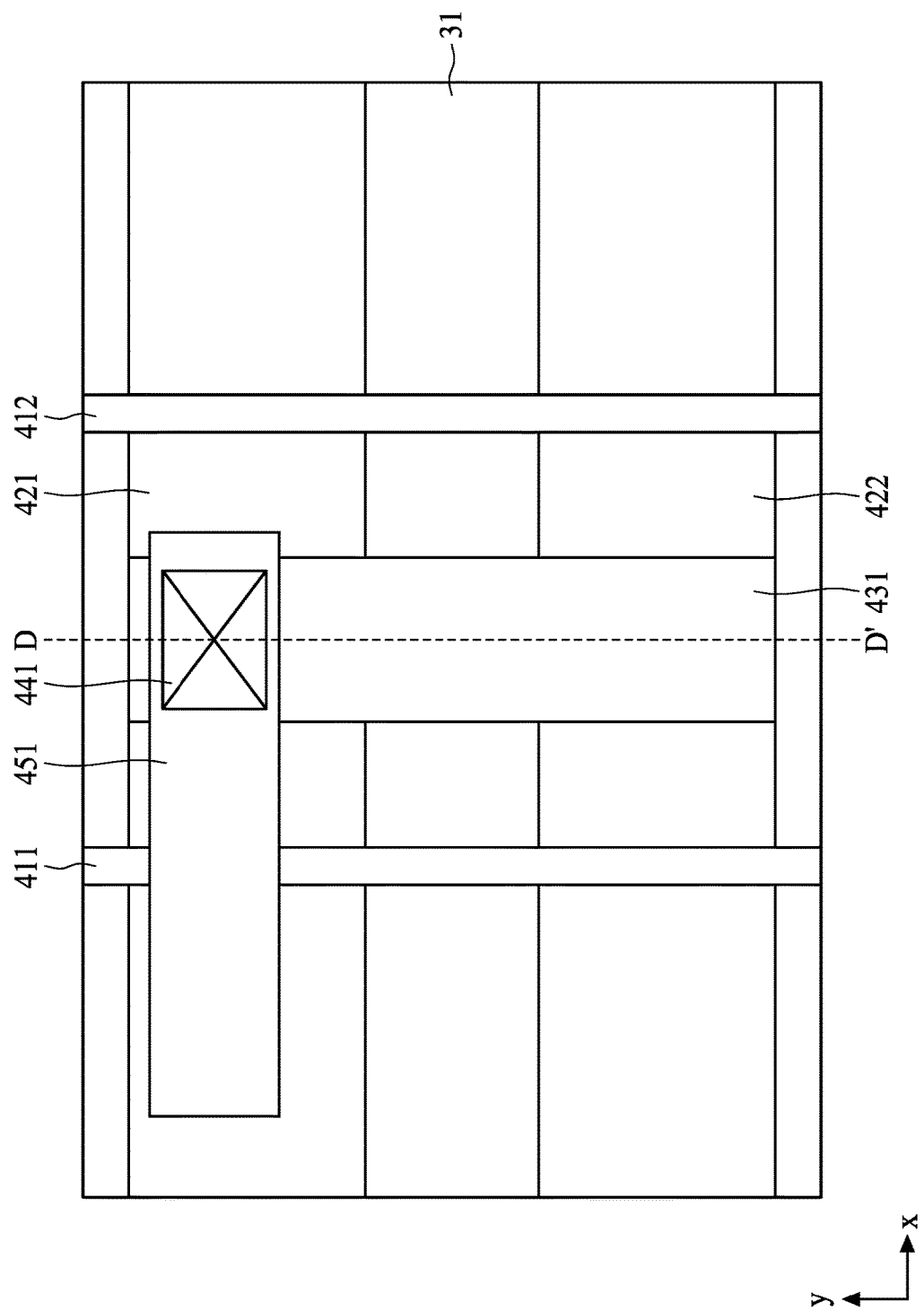
FIGS. 5A and 5B are diagrams illustrating a cell in accordance with a third embodiment of the present disclosure.
Figure 5B:
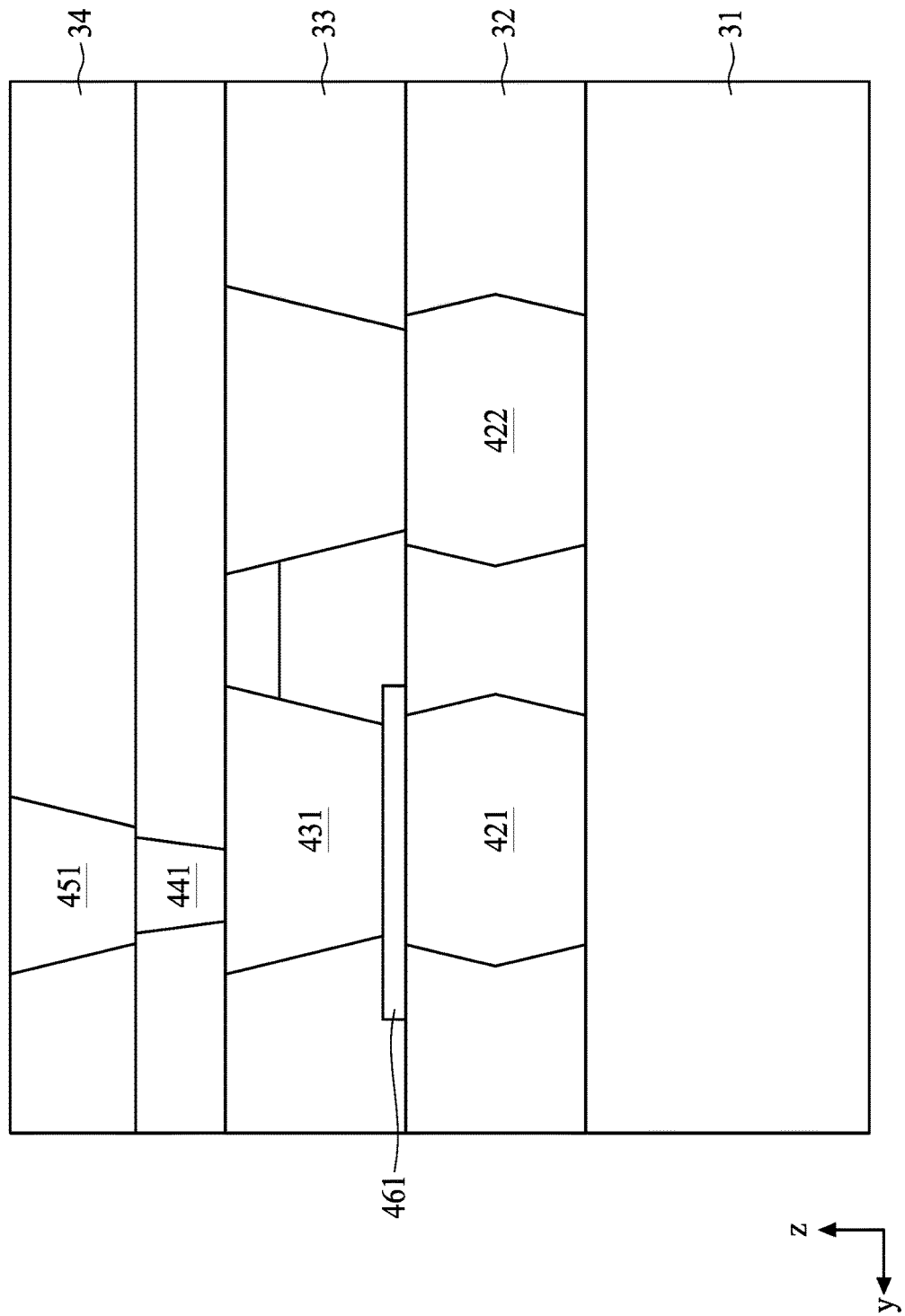

FIGS. 5A and 5B are diagrams illustrating a cell 5 in accordance with a third embodiment of the present disclosure. FIG. 5A is a schematic top view, and FIG. 5B is a cross-sectional view taken along line D-D' in FIG. 5A.

The cell 5 includes a substrate 31. In an embodiment, the substrate 31 includes a silicon substrate. Other elementary semiconductors such as germanium and diamond may also be included. Alternatively, the substrate 31 may include a compound semiconductor such as, silicon carbide, gallium arsenide, indium arsenide, or indium phosphide. Further, the substrate 31 may optionally include an SOI structure.

Moreover, the cell 5 further includes a transistor layer 32 on a first side of the substrate 31. The transistor layer 32 includes active regions where one or more transistors are formed. For example, the transistor layer 32 includes the gate regions 411 and 412 for depositing a poly gate material to form the gate terminals of transistors, and the source/drain regions 421 and 422 include epitaxial silicon, epitaxial silicon germanium, and/or other suitable epitaxial materials to form the source/drain terminals of transistors.

In addition, the cell 5 further includes a dielectric layer 33 on the transistor layer 32. The dielectric layer 33 includes conductive strips formed on the active regions as the MD mentioned above. For example, the dielectric layer 33 includes a conductive strip 431 formed on the source/drain region 422 and extending toward the source/drain region 421. Furthermore, the cell 5 further includes a first metal layer 34 on the dielectric layer 33. The first metal layer 34 includes a metal strip 451 extending in the x direction. More specifically, one end of the conductive strip 431 is connected to the metal strip 451 via a contact via 441 while the other end of the conductive strip 431 is connected to source/drain region 422.

In the embodiments of FIGS. 5A and 5B, the conductive strip 431 is arranged to transfer signals between the source/drain region 422 and the metal strip 451. Therefore, there is an isolation layer 461 between the conductive strip 431 and the source/drain region 421 to isolate the conductive strip 431 from the source/drain region 421.

Figure 6A:
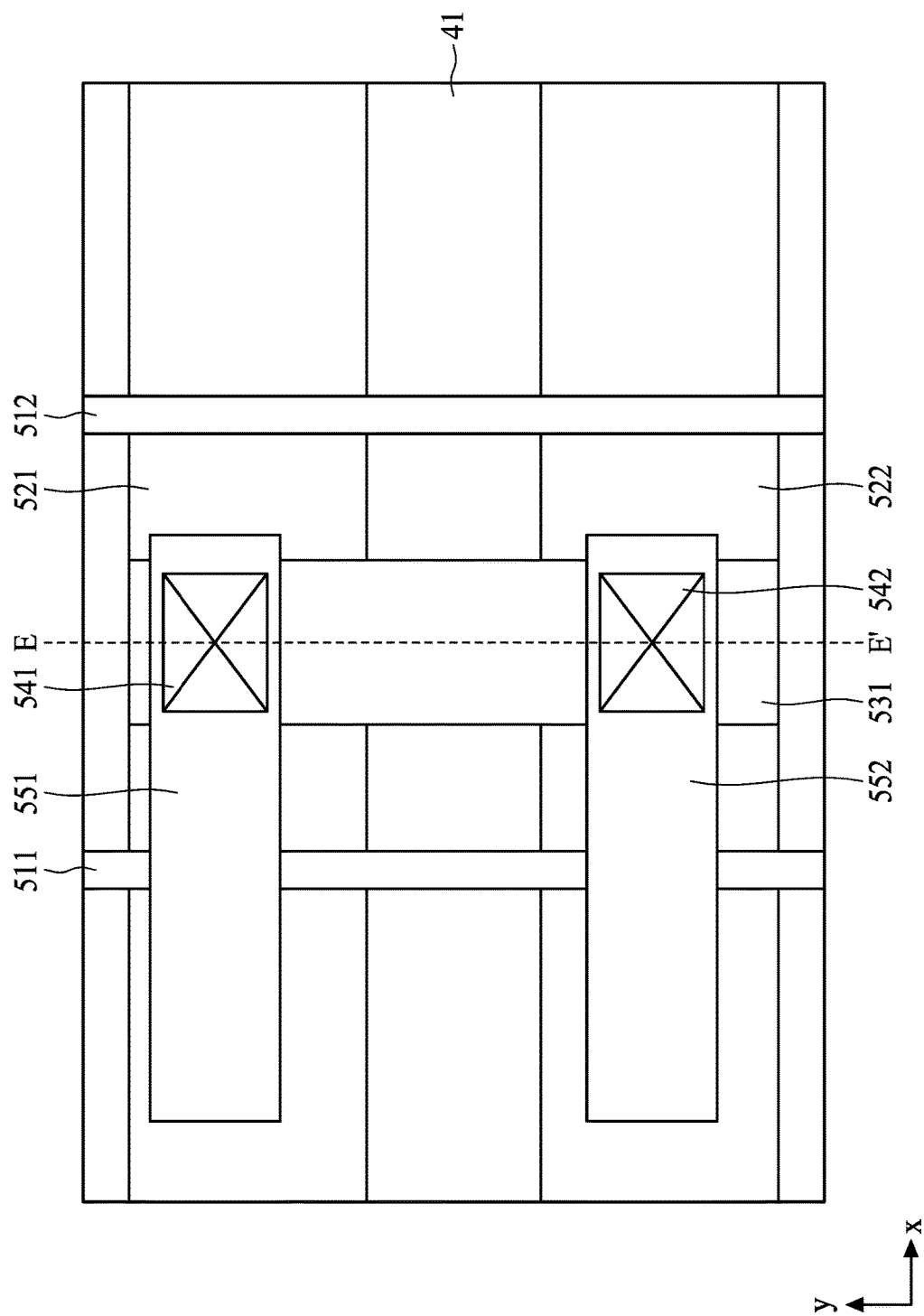
FIGS. 6A and 6B are diagrams illustrating a cell in accordance with a fourth embodiment of the present disclosure.
Figure 6B:
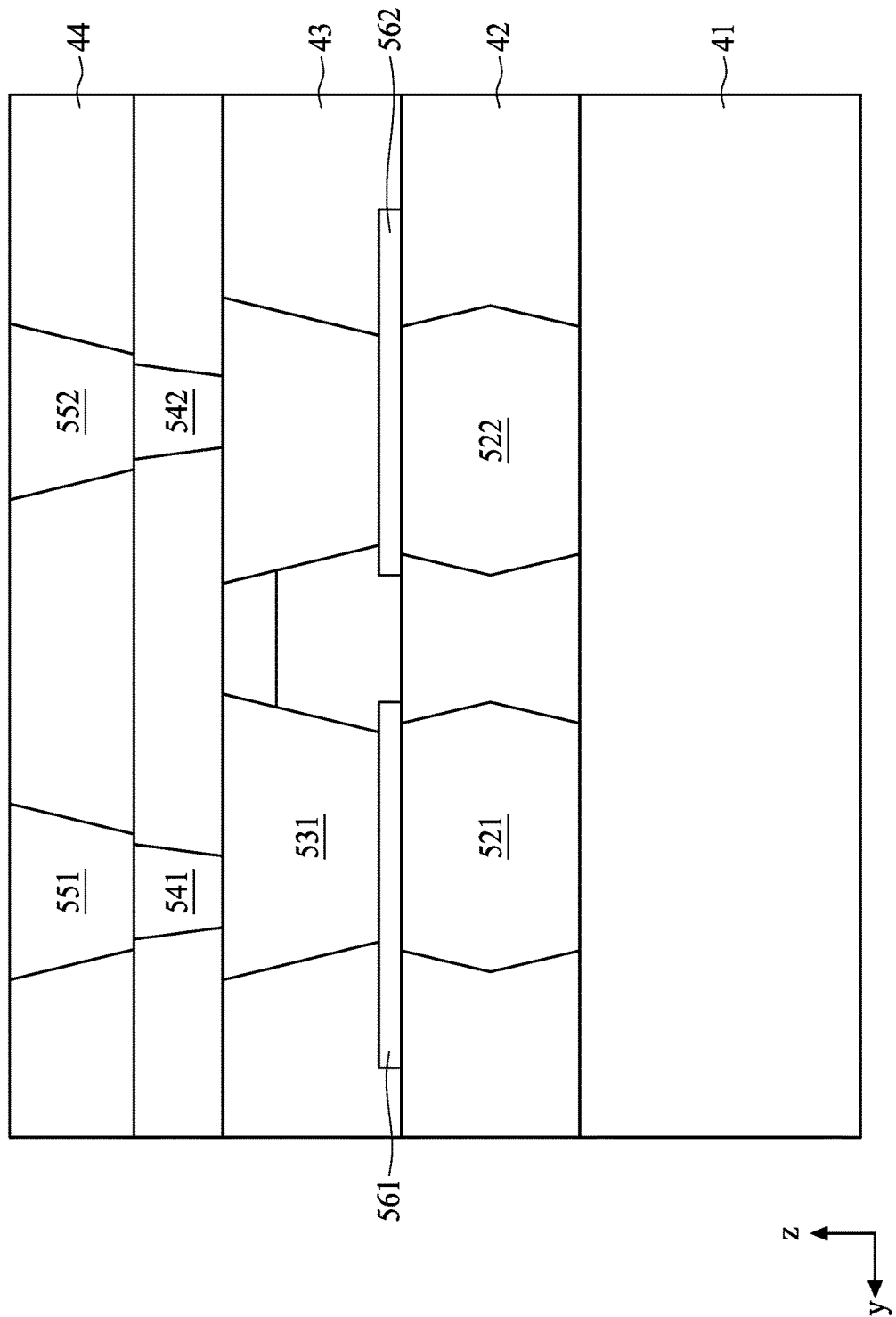

FIGS. 6A and 6B are diagrams illustrating a cell 6 in accordance with a fourth embodiment of the present disclosure. FIG. 6A is a schematic top view, and FIG. 6B is a cross-sectional view taken along line E-E' in FIG. 6A.

The cell 6 includes a substrate 41. In an embodiment, the substrate 41 includes a silicon substrate. Other elementary semiconductors such as germanium and diamond may also be included. Alternatively, the substrate 41 may include a compound semiconductor such as, silicon carbide, gallium arsenide, indium arsenide, or indium phosphide. Further, the substrate 41 may optionally include an SOI structure.

Moreover, the cell 6 further includes a transistor layer 42 on a first side of the substrate 41. The transistor layer 42 includes active regions where one or more transistors are formed. For example, the transistor layer 42 includes the gate regions 511 and 512 for depositing a poly gate material to form the gate terminals of transistors, and the source/drain regions 521 and 522 include epitaxial silicon, epitaxial silicon germanium, and/or other suitable epitaxial materials to form the source/drain terminals of transistors.

In addition, the cell 6 further includes a dielectric layer 43 on the transistor layer 42. The dielectric layer 43 includes conductive strips formed on the active regions as the MD mentioned above. For example, dielectric layer 43 includes a conductive strip 531. Furthermore, the cell 6 further includes a first metal layer 44 on the dielectric layer 43. The first metal layer 44 includes metal strips 551 and 552 extending in the x direction. More specifically, one end of the conductive strip 531 is connected to the metal strip 551 via a contact via 541 while the other end of the conductive strip 531 is connected to the metal strip 552 via a contact via 542.

In the embodiments of FIGS. 6A and 6B, the conductive strip 531 is arranged to transfer signals between the metal strip 551 and the metal strip 552. Therefore, there is an isolation layer 561 between the conductive strip 531 and the source/drain region 521 to isolate the conductive strip 531 from the source/drain region 521. There is an isolation layer 562 between the conductive strip 531 and the source/drain region 522 to isolate the conductive strip 531 from the source/drain region 522.

Figure 7A:
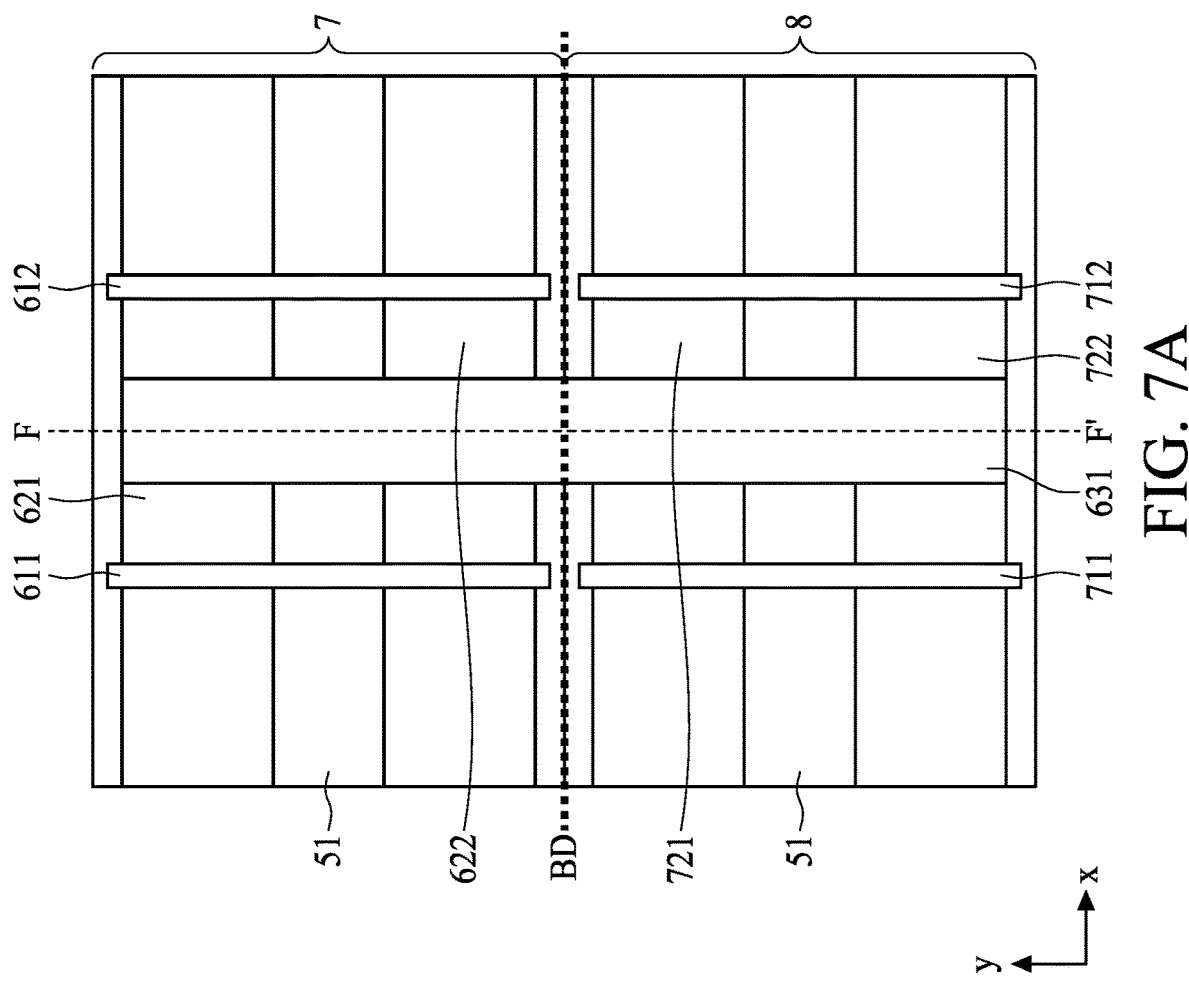
FIGS. 7A and 7B are diagrams illustrating two cells in accordance with a fifth embodiment of the present disclosure.
Figure 7B:
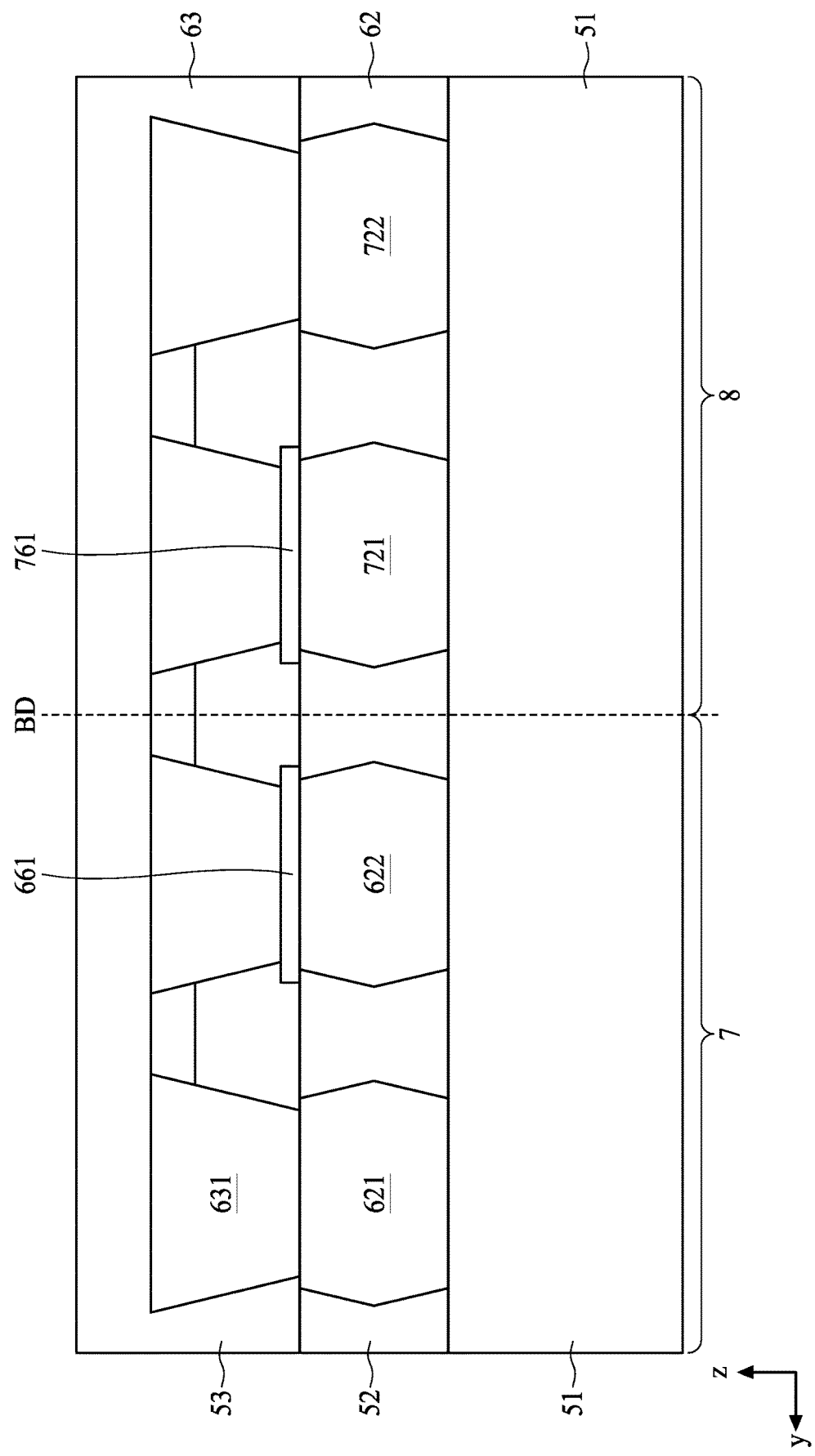

FIGS. 7A and 7B are diagrams illustrating a cell 7 and a cell 8 in accordance with a fifth embodiment of the present disclosure. FIG. 7A is a schematic top view, and FIG. 7B is a cross-sectional view taken along line F-F' in FIG. 7A. The cell 7 and the cell 8 are arranged in the y direction and integrated in a semiconductor device.

The cell 7 and the cell 8 share a substrate 51. In an embodiment, the substrate 51 includes a silicon substrate. Other elementary semiconductors such as germanium and diamond may also be included. Alternatively, the substrate 51 may include a compound semiconductor such as, silicon carbide, gallium arsenide, indium arsenide, or indium phosphide. Further, the substrate 51 may optionally include an SOI structure.

Moreover, the cell 7 includes a transistor layer 52 on a first side of the substrate 51. The transistor layer 52 includes active regions where one or more transistors are formed. For example, the transistor layer 52 includes the gate regions 611 and 612 for depositing a poly gate material to form the gate terminals of transistors, and the source/drain regions 621 and 622 include epitaxial silicon, epitaxial silicon germanium, and/or other suitable epitaxial materials to form the source/drain terminals of transistors.

The cell 8 includes a transistor layer 62 on the first side of the substrate 51, wherein the transistor layer 62 and the transistor layer 52 are coplanar. The transistor layer 62 includes active regions where one or more transistors are formed. For example, the transistor layer 62 includes the gate regions 711 and 712 for depositing a poly gate material to form the gate terminals of transistors, and the source/drain regions 721 and 722 include epitaxial silicon, epitaxial silicon germanium, and/or other suitable epitaxial materials to form the source/drain terminals of transistors.

In addition, the cell 7 further includes a dielectric layer 53 on the transistor layer 52, and the cell 8 further includes a dielectric layer 63 on the transistor layer 62. The dielectric layer 53 and the dielectric layer 63 are coplanar. Each of the dielectric layers 53 and 63 includes conductive strips formed on the active regions as the MD mentioned above. In this embodiment, a conductive strip 631 extends in the y direction across a boundary BD between the cell 7 and the cell 8. Specifically, the conductive strip 631 is connected between the source/drain region 621 and the source/drain region 722 for signal connection.

In this embodiment, each of the cells 7 and 8 includes two source/drain regions, that is, the cell height of the cells 7 and 8 are equal. With such configuration, the boundary BD is defined to be the boundary between the cells located immediately adjacent and having equal cell height.

Figure 7C:
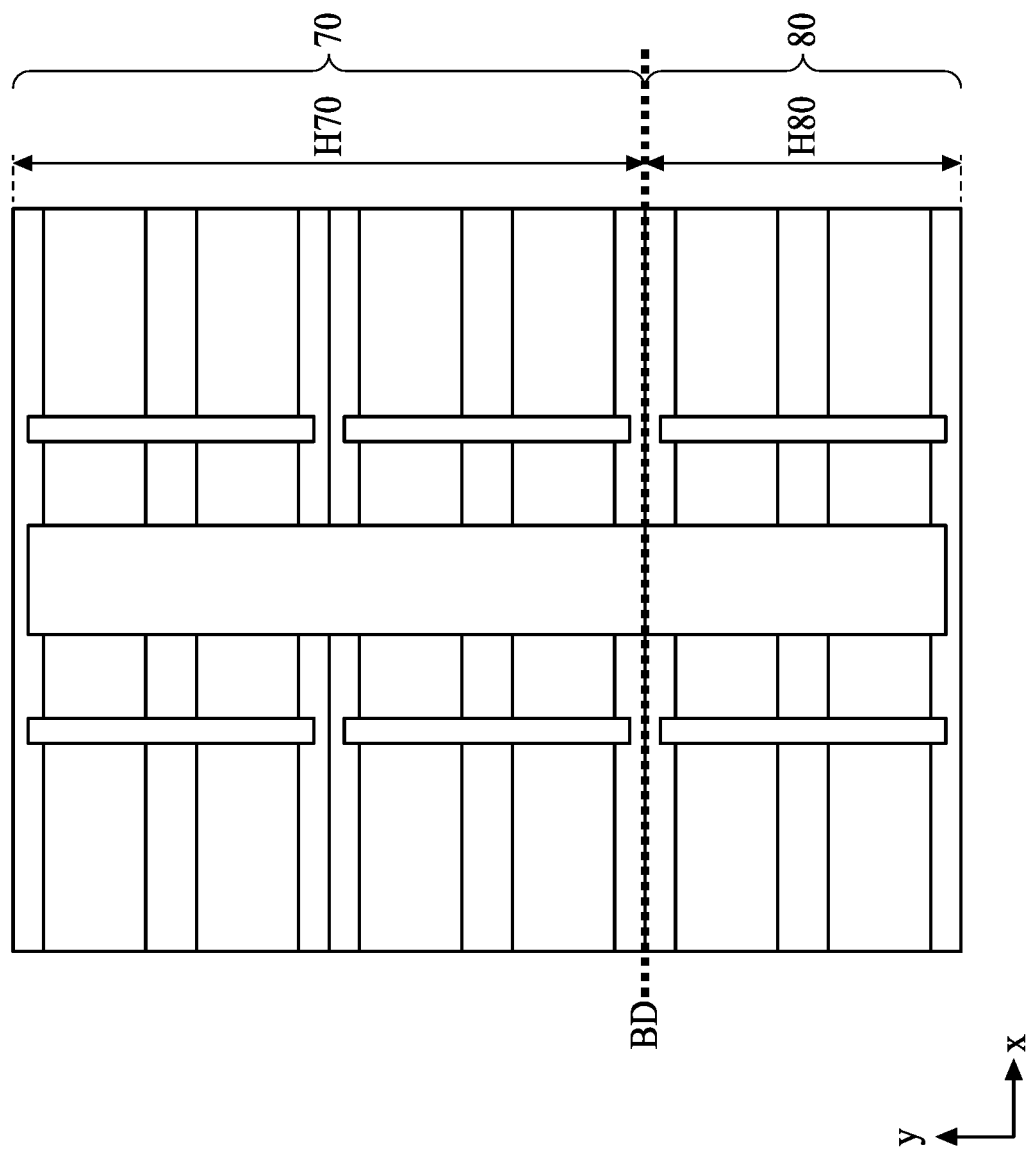
FIG. 7C is a diagram illustrating cells with different cell height according to an embodiment of the present disclosure.

However, in other embodiments, a cell might include more source/drain regions for specific function. Therefore, the cell height can be longer. Refer to FIG. 7C, a cell height H70 of a cell 70 is twice as the cell height H80 of a cell 80 since the cell 70 includes more source/drain regions than the cell 80. With such configuration, the boundary is defined to be the boundary between the cells located immediately adjacent and having different cell height.

In the embodiments of FIGS. 7A and 7B, the conductive strip 631 is arranged to transfer signals between the source/drain region 621 and the source/drain region 722. Therefore, there is an isolation layer 661 between the conductive strip 631 and the source/drain region 622 to isolate the conductive strip 631 from the source/drain region 622. In addition, there is an isolation layer 761 between the conductive strip 631 and the source/drain region 721 to isolate the conductive strip 631 from the source/drain region 721.

Figure 8A:
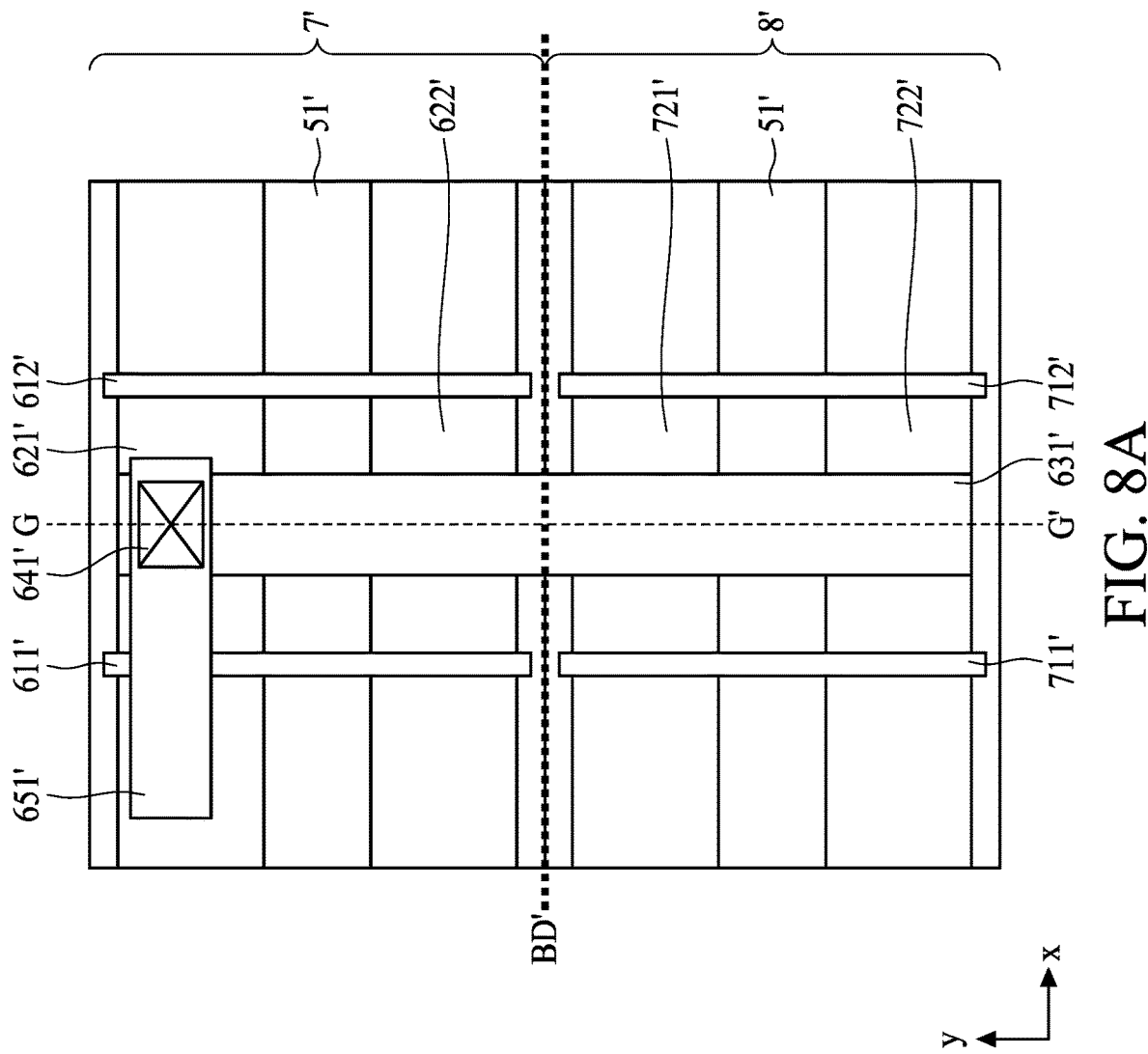
FIGS. 8A and 8B are diagrams illustrating two cells in accordance with a sixth embodiment of the present disclosure.
Figure 8B:
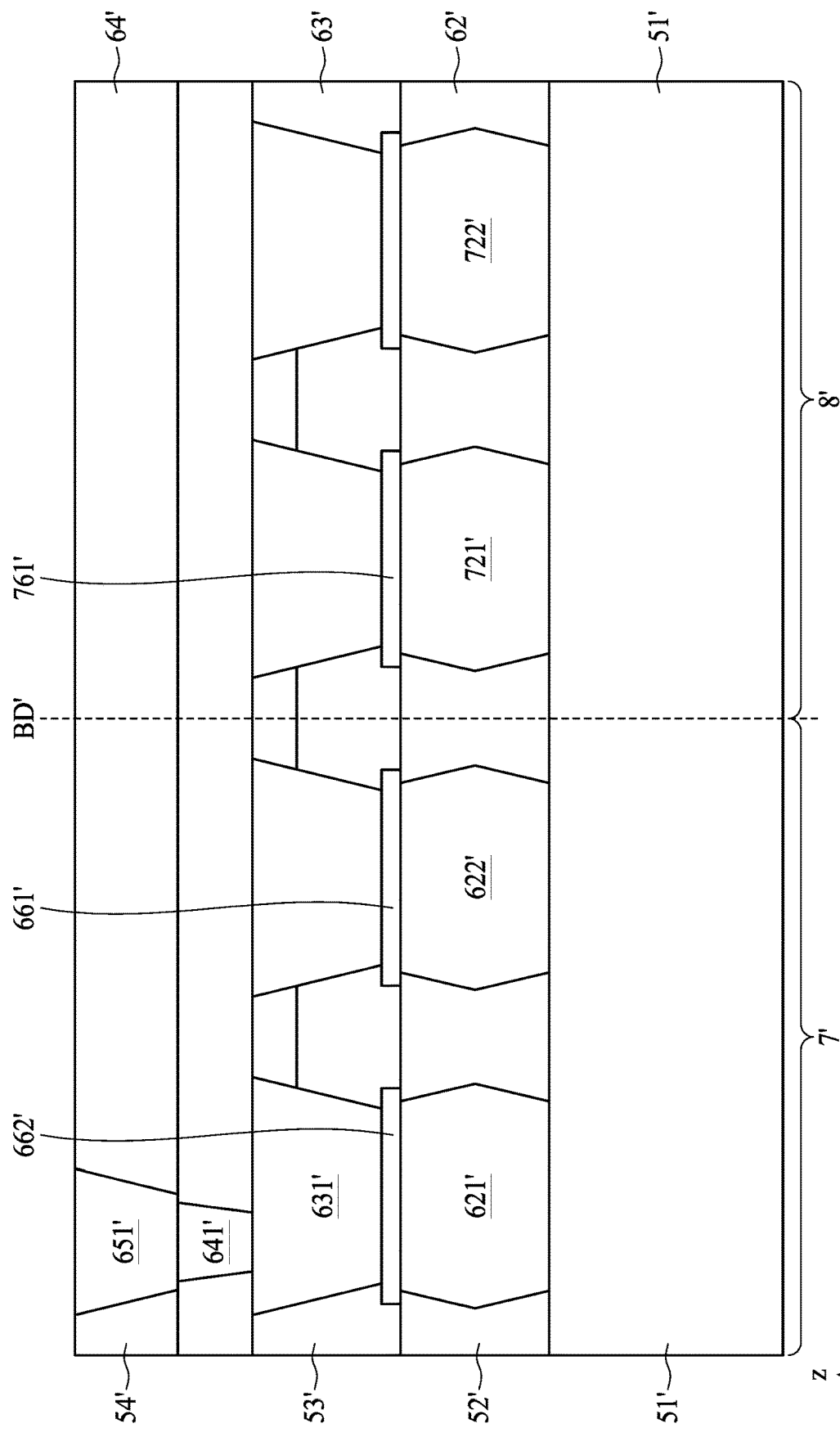

FIGS. 8A and 8B are diagrams illustrating a cell 7' and a cell 8' in accordance with a sixth embodiment of the present disclosure. FIG. 8A is a schematic top view, and FIG. 8B is a cross-sectional view taken along line G-G' in FIG. 8A. The cell 7' and the cell 8' are arranged in the y direction and integrated in a semiconductor device.

The cell 7' and the cell 8' share a substrate 51'. In an embodiment, the substrate 51' includes a silicon substrate. Other elementary semiconductors such as germanium and diamond may also be included. Alternatively, the substrate 51' may include a compound semiconductor such as, silicon carbide, gallium arsenide, indium arsenide, or indium phosphide. Further, the substrate 51' may optionally include an SOI structure.

Moreover, the cell 7' includes a transistor layer 52' on a first side of the substrate 51'. The transistor layer 52' includes active regions where one or more transistors are formed. For example, the transistor layer 52' includes the gate regions 611' and 612' for depositing a poly gate material to form the gate terminals of transistors, and the source/drain regions 621' and 622' include epitaxial silicon, epitaxial silicon germanium, and/or other suitable epitaxial materials to form the source/drain terminals of transistors.

The cell 8' includes a transistor layer 62' on the first side of the substrate 51', wherein the transistor layer 62' and the transistor layer 52' are coplanar. The transistor layer 62' includes active regions where one or more transistors are formed. For example, the transistor layer 62' includes the gate regions 711' and 712' for depositing a poly gate material to form the gate terminals of transistors, and the source/drain regions 721' and 722' include epitaxial silicon, epitaxial silicon germanium, and/or other suitable epitaxial materials to form the source/drain terminals of transistors.

In addition, the cell 7' further includes a dielectric layer 53' on the transistor layer 52' and the cell 8' further includes a dielectric layer 63' on the transistor layer 62'. The dielectric layer 53' and the dielectric layer 63' are coplanar. Each of the dielectric layers 53' and 63' includes conductive strips formed on the active regions as the MD mentioned above. In this embodiment, a conductive strip 631' extends in the y direction across a boundary BD' between the cell 7' and the cell 8'.

Furthermore, the cell 7' includes a first metal layer 54' on the dielectric layer 53', and the cell 8' includes a first metal layer 64' on the dielectric layer 63', wherein the first metal layer 54' and the first metal layer 64' are coplanar. Each of the first metal layer 54' and the first metal layer 64' includes metal strips extending in the x direction. For example, the first metal layer 54' includes metal strip 651' extending in the x direction. Specifically, one end of the conductive strip 631' is connected to the metal strip 651' via a contact via 641' while the other end of the conductive strip 631' is connected to the source/drain region 722'.

In the embodiments of FIGS. 8A and 8B the conductive strip 631' is arranged to transfer signals between the source/drain region 722' and the metal strip 651'. Therefore, there is an isolation layer 662' between the conductive strip 631' and the source/drain region 621' to isolate the conductive strip 631' from the source/drain region 621'. Moreover, there is an isolation layer 661' between the conductive strip 631' and the source/drain region 622' to isolate the conductive strip 631' from the source/drain region 622'. Furthermore, there is an isolation layer 761' between the conductive strip 631' and the source/drain region 721' to isolate the conductive strip 631' from the source/drain region 721'.

Figure 9A:
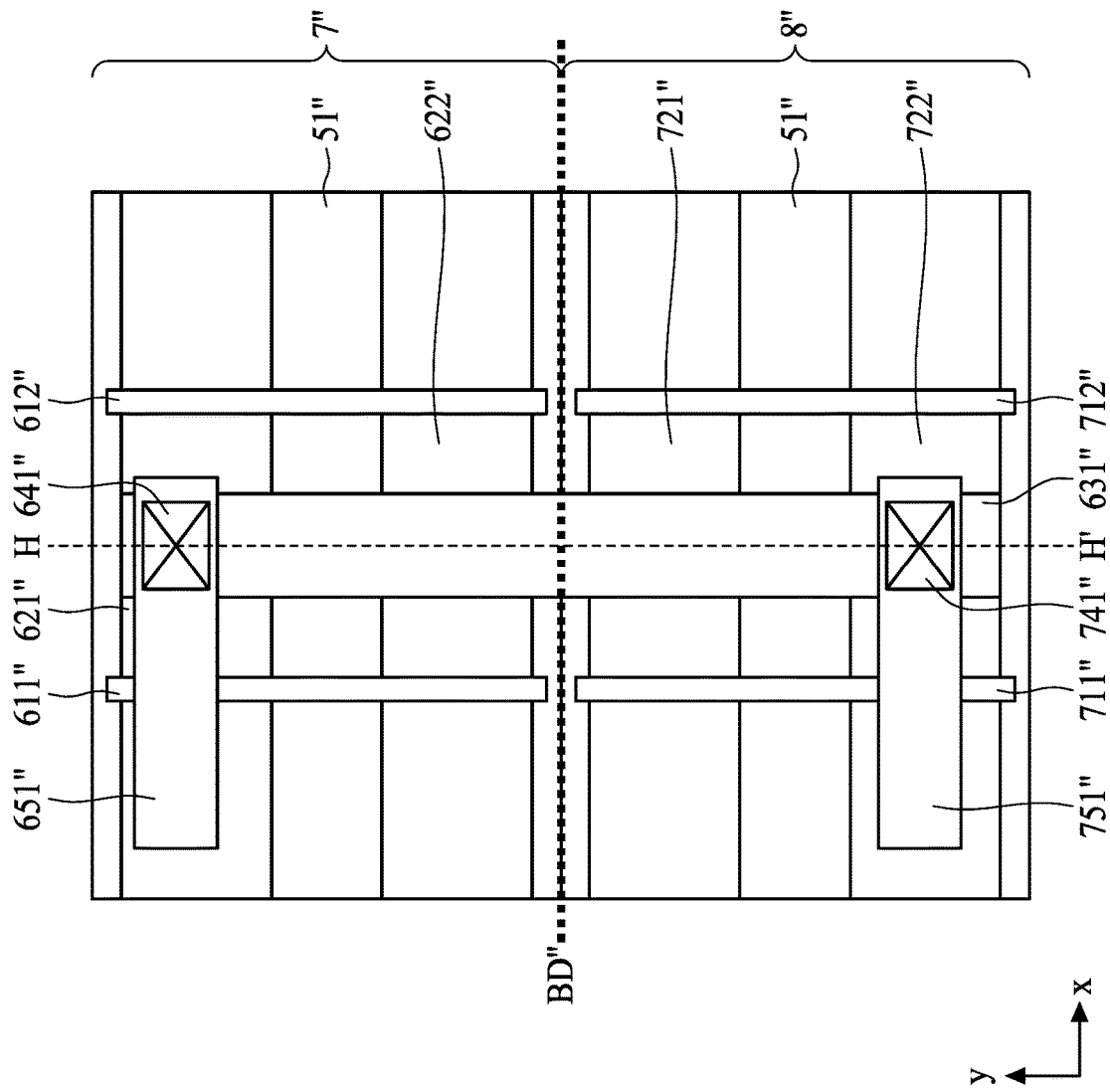
FIGS. 9A and 9B are diagrams illustrating two cells in accordance with a seventh embodiment of the present disclosure.
Figure 9B:
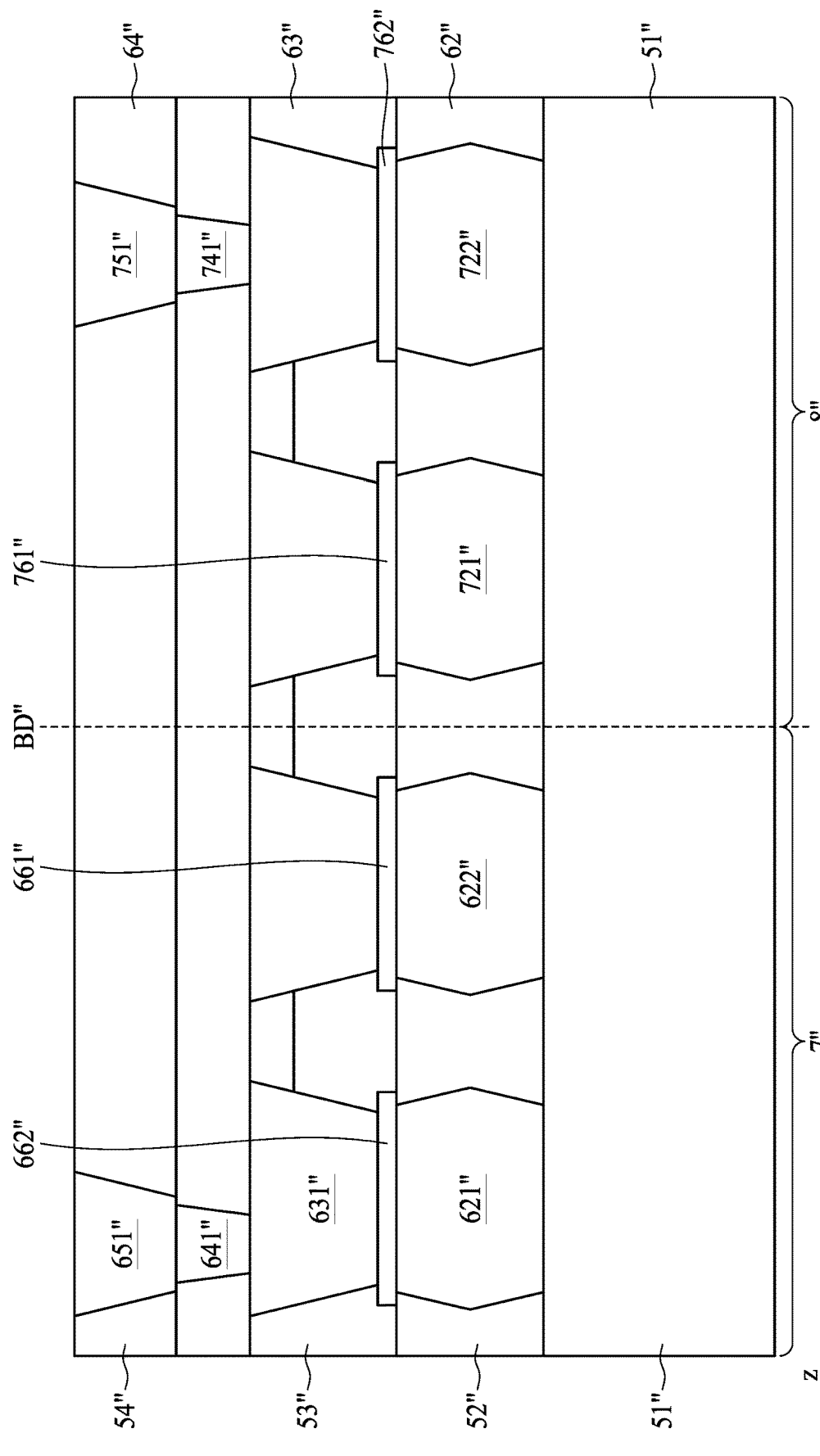

FIGS. 9A and 9B are diagrams illustrating a cell 7" and a cell 8" in accordance with a seventh embodiment of the present disclosure. FIG. 9A is a schematic top view, and FIG. 9B is a cross-sectional view taken along line H-H' in FIG. 9A. The cell 7" and the cell 8" are arranged in the y direction and integrated in a semiconductor device.

The cell 7" and the cell 8" share a substrate 51". In an embodiment, the substrate 51" includes a silicon substrate. Other elementary semiconductors such as germanium and diamond may also be included. Alternatively, the substrate 51" may include a compound semiconductor such as, silicon carbide, gallium arsenide, indium arsenide, or indium phosphide. Further, the substrate 51" may optionally include an SOI structure.

Moreover, the cell 7" includes a transistor layer 52" on a first side of the substrate 51". The transistor layer 52" includes active regions where one or more transistors are formed. For example, the transistor layer 52" includes the gate regions 611" and 612' for depositing a poly gate material to form the gate terminals of transistors, and the source/drain regions 621" and 622" include epitaxial silicon, epitaxial silicon germanium, and/or other suitable epitaxial materials to form the source/drain terminals of transistors.

The cell 8" includes a transistor layer 62" on the first side of the substrate 51", wherein the transistor layer 62" and the transistor layer 52" are coplanar. The transistor layer 62" includes active regions where one or more transistors are formed. For example, the transistor layer 62" includes the gate regions 711" and 712" for depositing a poly gate material to form the gate terminals of transistors, and the source/drain regions 721" and 722" including epitaxial silicon, epitaxial silicon germanium, and/or other suitable epitaxial materials to form the source/drain terminals of transistors.

In addition, the cell 7" further includes a dielectric layer 53" on the transistor layer 52", and the cell 8" further includes a dielectric layer 63" on the transistor layer 62". The dielectric layer 53" and the dielectric layer 63" are coplanar. Each of the dielectric layers 53" and 63" includes conductive strips formed on the active regions as the MD mentioned above. In this embodiment, a conductive strip 631" extends in the y direction across a boundary BD" between the cell 7' and the cell 8".

Furthermore, the cell 7" includes a first metal layer 54" on the dielectric layer 53" while the cell 8" includes a first metal layer 64" on the dielectric layer 63", wherein the first metal layer 54" and the first metal layer 64" are coplanar. Each of the first metal layer 54" and the first metal layer 64" includes metal strips extending in the x direction. For example, the first metal layer 54" includes metal strip 651' extending in the x direction while the first metal strip includes metal strip 751" extending in the x direction. Specifically, one end of the conductive strip 631"' is connected to the metal strip 651" via a contact via 641"' while the other end of the conductive strip 631" is connected to the metal strip 751" via a contact via 741".

In the embodiments of FIGS. 9A and 9B the conductive strip 631" is arranged to transfer signals between the metal strip 651"' and the metal strip 751". Therefore, there is an isolation layer 662" between the conductive strip 631" and the source/drain region 621" to isolate the conductive strip 631" from the source/drain region 621". Also, there is an isolation layer 661" between the conductive strip 631" and the source/drain region 622" to isolate the conductive strip 631" from the source/drain region 622". Moreover, there is an isolation layer 761" between the conductive strip 631" and the source/drain region 721" to isolate the conductive strip 631" from the source/drain region 721'. Furthermore, there is an isolation layer 762" between the conductive strip 631" and the source/drain region 722" to isolate the conductive strip 631" from the source/drain region 722".

In the aforementioned embodiments, the conductive strips extend across the boundary between two cells for signal connection. However, this is not a limitation of the present disclosure. In other embodiments, the conductive strips can extend across more than two cells.

Figure 10:
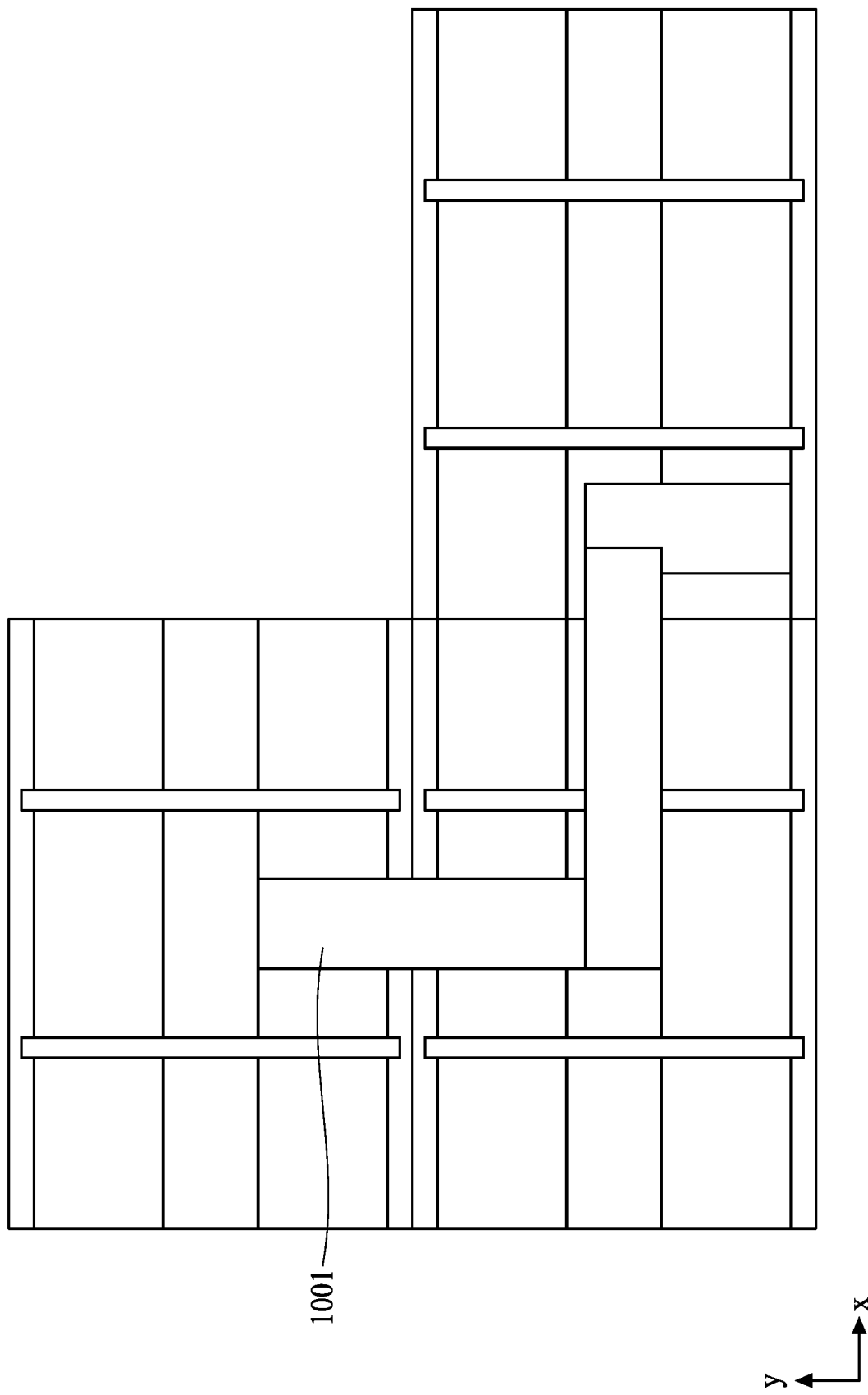
FIG. 10 is a diagram illustrating a route of a conductive strip in accordance with an embodiment of the present disclosure.

FIG. 10 is a diagram illustrating a route of a conductive strip 1001 in accordance with an embodiment of the present disclosure. As shown in FIG. 10, the conductive strip 1001 routes through two corners and across over three cells, wherein the conductive strip 1001 is connected between two source/drain regions for signal connection. Those skilled in the art should readily understand the embodiment of FIG. 10 after reading the embodiments of FIGS. 4, 7A and 7B.

Figure 11:
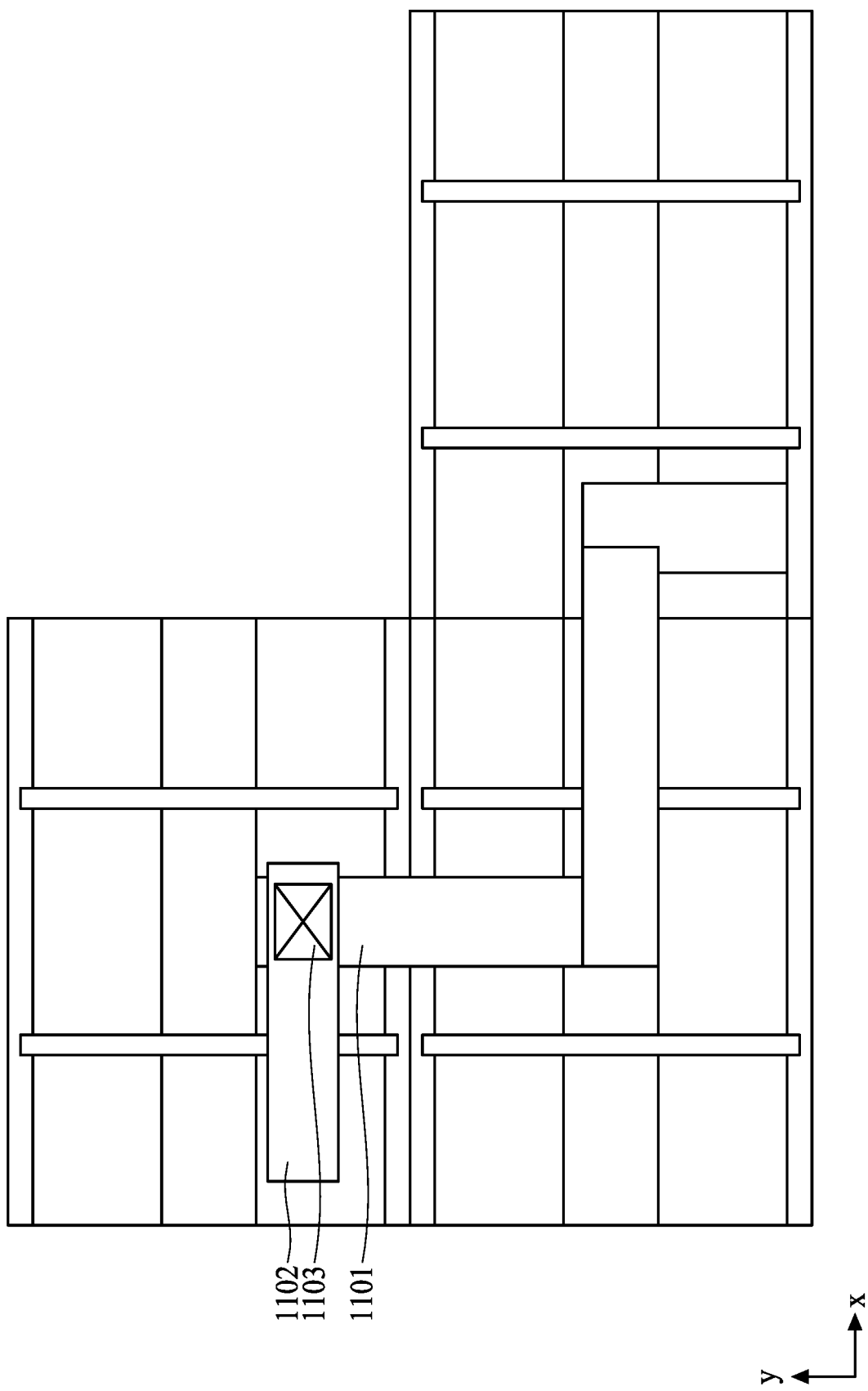
FIG. 11 is a diagram illustrating a route of a conductive strip in accordance with another embodiment of the present disclosure.

FIG. 11 is a diagram illustrating a route of a conductive strip 1101 in accordance with another embodiment of the present disclosure. As shown in FIG. 11, the conductive strip 1101 routes through two corners and across over three cells, wherein one end of the conductive strip 1101 is connected to a metal strip 1102 via a contact via 1103 while the other end of the conductive strip 1101 is connected to the source/drain region for signal connection. Those skilled in the art should readily understand the embodiment of FIG. 11 after reading the embodiments of FIGS. 8A and 8B.

Figure 12:
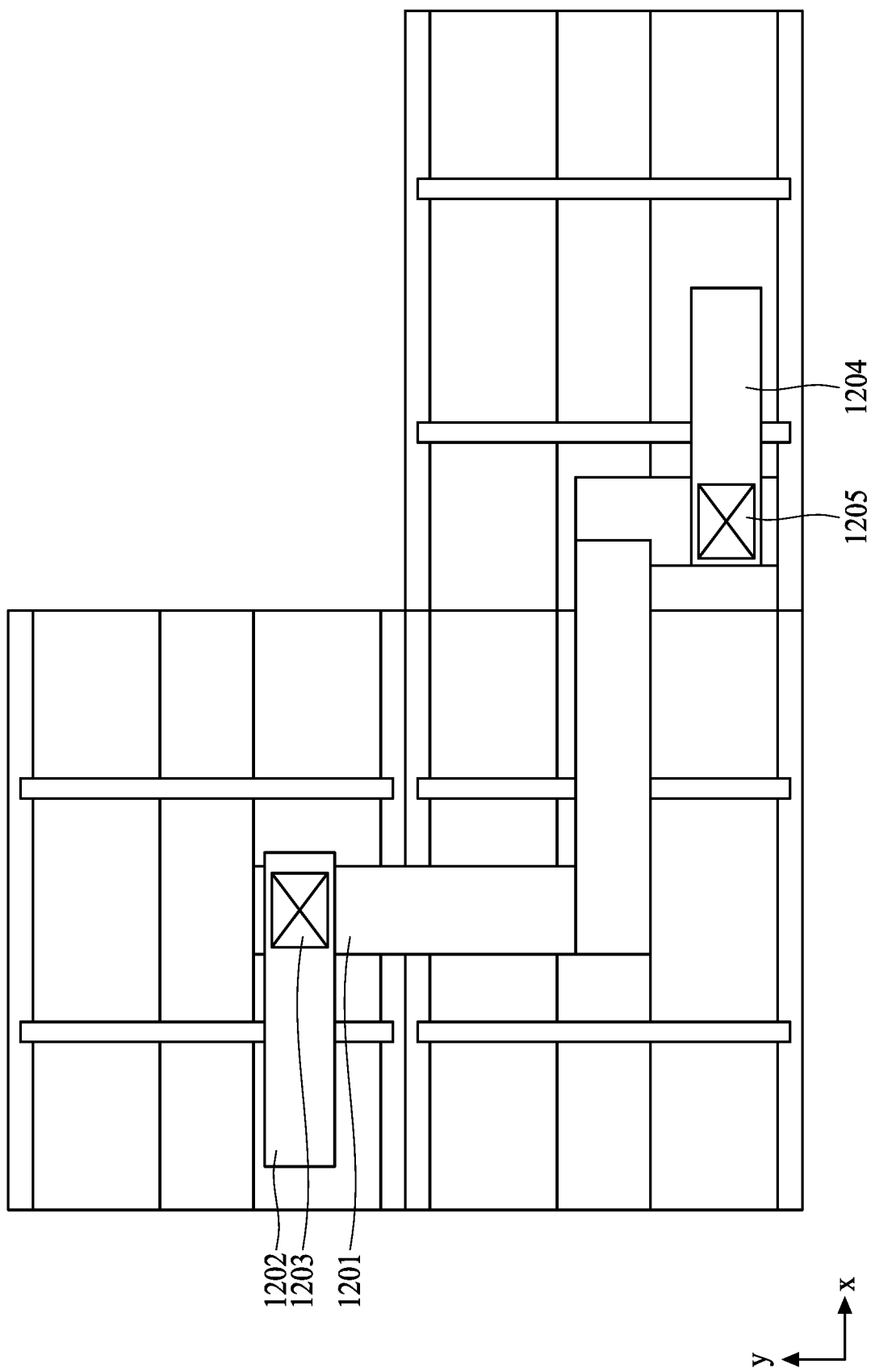
FIG. 12 is a diagram illustrating a route of a conductive strip in accordance with yet another embodiment of the present disclosure.

FIG. 12 is a diagram illustrating a route of a conductive strip 1201 in accordance with yet another embodiment of the present disclosure. As shown in FIG. 12, the conductive strip 1201 routes through two corners and across over three cells, wherein one end of the conductive strip 1201 is connected to a metal strip 1202 via a contact via 1203 while the other end of the conductive strip 1201 is connected to a metal strip 1204 via a contact via 1205 for signal connection. Those skilled in the art should readily understand the embodiment of FIG. 12 after reading the embodiments of FIGS. 9A and 9B.

Figure 13A:
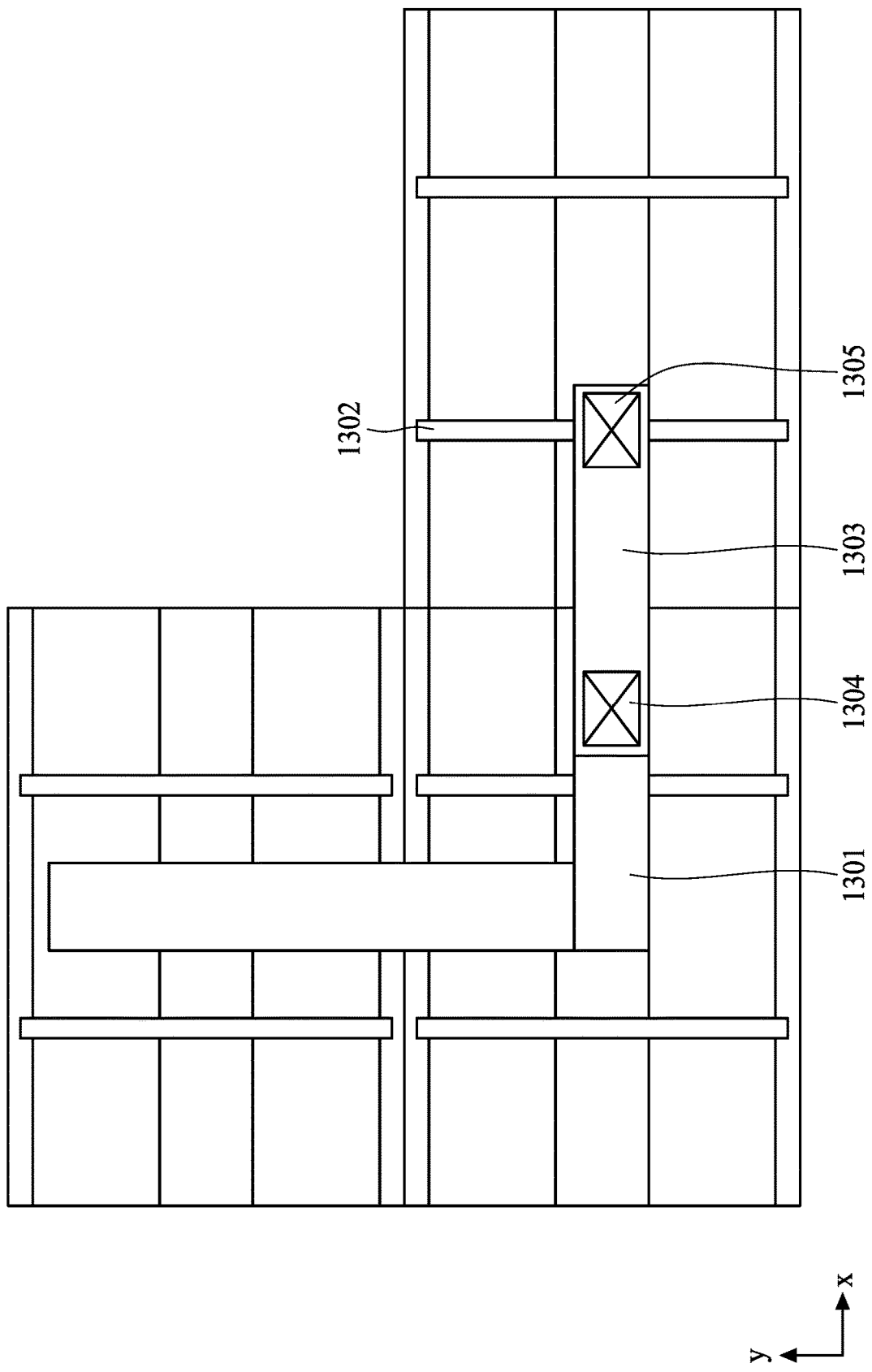
FIGS. 13A and 13B are diagrams illustrating connections between a conductive strip and a gate region according to an embodiment of the present disclosure.
Figure 13B:
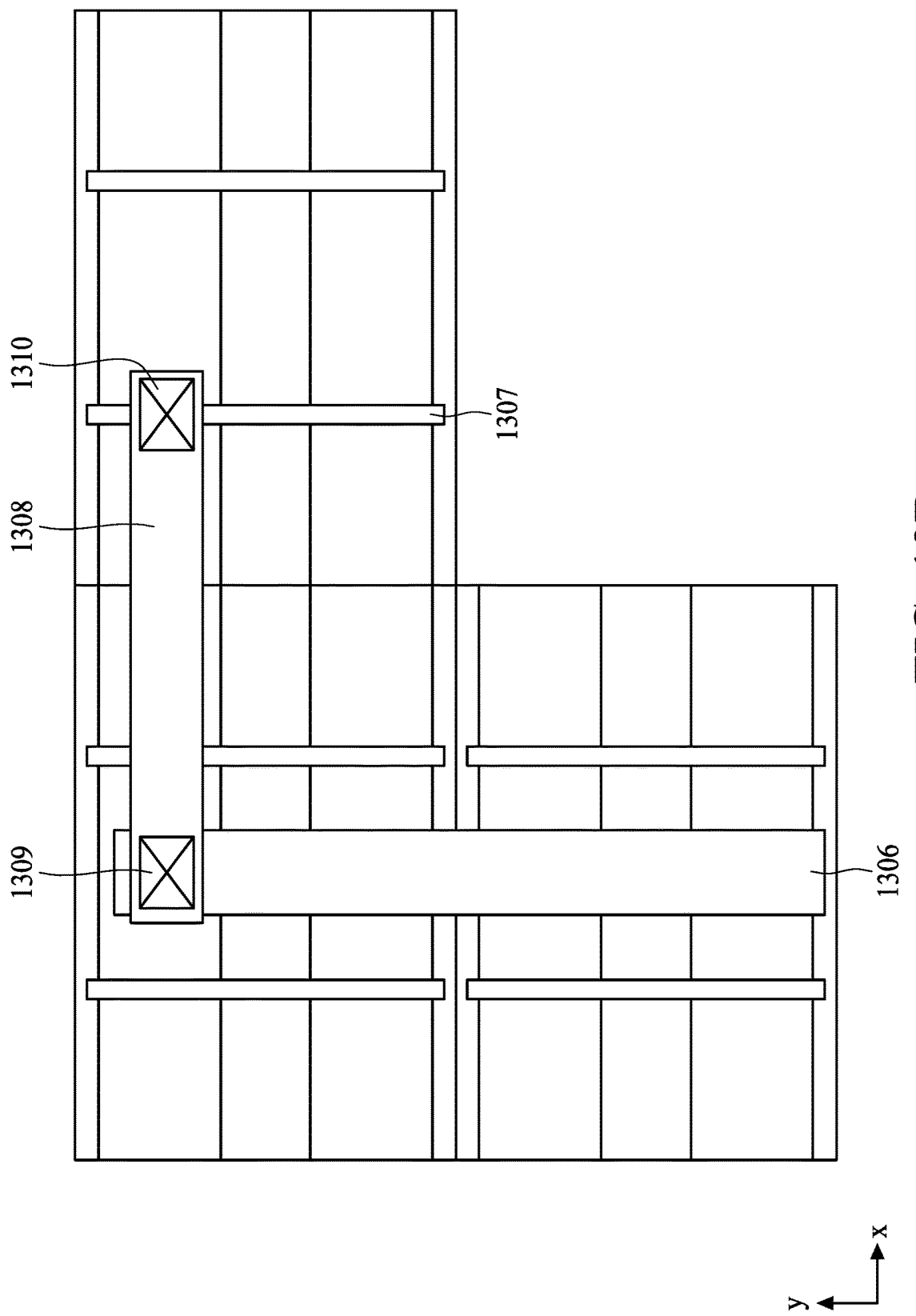

FIGS. 13A and 13B are diagrams illustrating connections between a conductive strip and a gate region according to an embodiment of the present disclosure. As shown in FIG. 13A, the conductive strip 1301 is connected to the gate region 1302 through a metal strip 1303 as a bridge. Specifically, one end of the metal strip 1303 is connected to the conductive strip 1301 via a contact via 1304 while the other end of the metal strip 1303 is connected to the gate region 1302 via a contact via 1305.

As shown in FIG. 13B, the conductive strip 1306 is connected to the gate region 1307 through a metal strip 1308 as a bridge. Specifically, one end of the metal strip 1308 is connected to the conductive strip 1306 via a contact via 1309 while the other end of the metal strip 1308 is connected to the gate region 1307 via a contact via 1310.

The embodiments of FIGS. 13A and 13B propose connection between the conductive strip and the gate region, which provides more flexibilities for circuit design.

Figure 14:
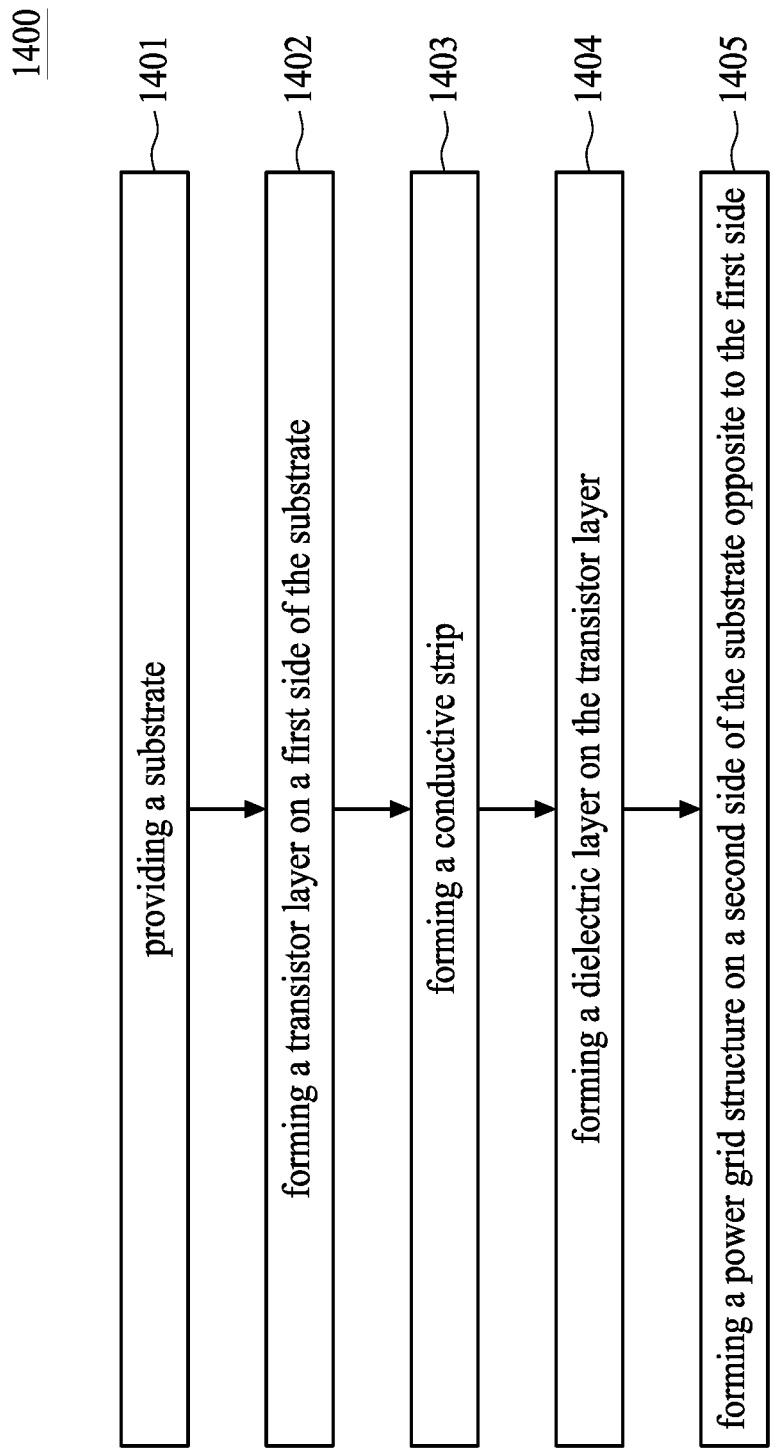
FIG. 14 is a diagram illustrating a method of manufacturing a semiconductor device in accordance with an embodiment of the present disclosure.

FIG. 14 is a flowchart illustrating a method 1400 of manufacturing a semiconductor device in accordance with an embodiment of the present disclosure. Provided that the results are substantially the same, the operations in FIG. 14 are not required to be executed in the exact order. The method 1400 can be summarized as follows.

In operation 1401, a substrate is provided.

In operation 1402, a transistor layer is formed on a first side of the substrate, wherein the transistor layer includes a plurality of active regions for forming transistors.

In operation 1403, a conductive strip is formed on a first active region, wherein the conductive strip extends toward to a second active region for signal connection.

In operation 1404, a dielectric layer is formed on the transistor layer, covering the connecting strip.

In operation 1405, a power grid structure is formed on a second side of the substrate opposite to the first side, wherein the power grid structure is arranged to direct a power source to the transistor layer.

Those skilled in the art should readily understand the method 1400 after reading the aforementioned embodiments. The detailed description of the method 1400 is omitted here for brevity.

Figure 15:
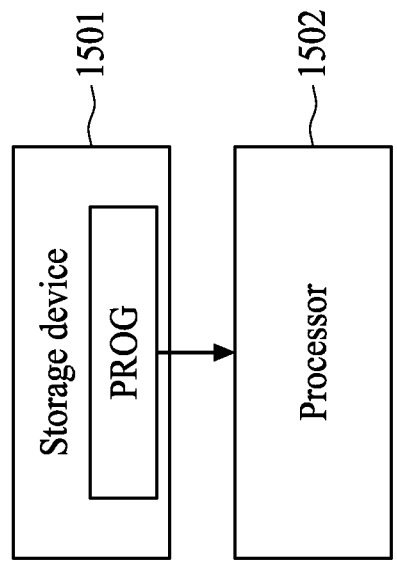
FIG. 15 is a diagram illustrating a system in accordance with an embodiment of the present disclosure.

FIG. 15 is a diagram illustrating a system 1500 in accordance with an embodiment of the present disclosure. The system 1500 includes a storage device 1501 and a processor 1502. The storage device 1501 is arranged to store a program code PROG. When loaded and executed by the processor 1502, the program code instructs the processor 1502 to execute the following operations: providing a substrate; forming a transistor layer on a first side of the substrate, wherein the transistor layer includes a plurality of active regions for forming a terminal of a transistor; forming a conductive strip on a first active region, extending toward a second active region for signal connection; forming a dielectric layer on the transistor layer, covering the conductive strip; and forming a power grid structure on a second side of the substrate opposite to the first side, wherein the power grid structure is arranged to direct a power source to the transistor layer.

Those skilled in the art should readily understand the operation of the system 1500 after reading the aforementioned embodiments. The detailed description of the system 1500 is omitted here for brevity.

In some embodiments, a semiconductor device is disclosed. The semiconductor device includes a transistor layer, a dielectric layer, a conductive strip and a power grid structure. The transistor layer includes a first active region configured to be a source/drain terminal of a first transistor and a second active region configured to be a source/drain terminal of a second transistor. The bottom surface of the dielectric layer is in direct contact with top surfaces of the source/drain terminals of the first and second transistors. The conductive strip is included in the dielectric layer and extends from the first active region toward the second active region for signal connection. The power grid structure is arranged to direct a power source to the transistor layer from a bottom of the transistor layer.

In some embodiments, A method of manufacturing a semiconductor device is disclosed. The method includes: forming a transistor layer including a plurality of active regions for forming transistors; forming a conductive strip extending from a first active region toward to a second active region for signal connection; forming a dielectric layer on the transistor layer, wherein the dielectric layer includes the conductive strip; and forming a power grid structure arranged to direct a power source to the transistor layer from a bottom of the transistor layer, wherein forming the transistor layer includes: forming a first cell including the first active region; and forming a second cell including the second active region; and forming the conductive strip, on the first active region includes: forming the conductive strip extending across a boundary between the first cell and the second cell.

In some embodiments, a system is disclosed. The system includes a storage arranged to store a program code and a processor. When executed and loaded by the processor, the program code instructs the processor to execute following operations: forming a transistor layer including a plurality of active regions for forming transistors: forming a conductive strip extending from a first active region toward to a second active region for signal connection; forming a dielectric layer on the transistor layer, wherein the dielectric layer includes the conductive strip; and forming a power grid structure arranged to direct a power source to the transistor layer from a bottom of the transistor layer; wherein forming the transistor layer-includes: forming a first cell including the first active region; and forming a second cell including the second active region; and forming the conductive strip, on the first active region includes: forming the conductive strip extending across a boundary between the first cell and the second cell.

What is claimed is:

1. A semiconductor device, comprising:
a transistor layer, including a first active region configured to be a source/drain terminal of a first transistor and a second active region configured to be a source/drain terminal of a second transistor;
a dielectric layer, a bottom surface of the dielectric layer in direct contact with top surfaces of the source/drain terminals of the first and second transistors;
a conductive strip, included in the dielectric layer and extending from the first active region toward the second active region for signal connection; and
a power grid structure, arranged to direct a power source to the transistor layer from a bottom of the transistor layer.

2. The semiconductor device of claim 1, wherein the transistor layer includes a first cell including the first active region and the second active region.

3. The semiconductor device of claim 2, wherein the conductive strip is connected between the first active region and the second active region for signal connection.

4. The semiconductor device of claim 2, further comprising:
a plurality of metal strips, on the dielectric layer, extending in a first direction for signal connection,
wherein the conductive strip extends in a second direction orthogonal to the first direction, and one end of the conductive strip is connected to one of the plurality of metal strips for signal connection via a contact via.

5. The semiconductor device of claim 1, wherein the transistor layer includes a first cell and a second cell, the first cell includes the first active region while the second cell includes the second active region, and the conductive strip extends across a boundary between the first cell and the second cell.

6. The semiconductor device of claim 5, wherein the conductive strip is connected between the first active region and the second active region.

7. The semiconductor device of claim 6, wherein the conductive strip route through a turning corner.

8. The semiconductor device of claim 5, further comprising:
a plurality of metal strips, disposed above the dielectric layer, and extends in a first direction for signal connection;
wherein one end of the conductive strip is connected to one of the plurality of metal strips for signal connection via a contact via.

9. The semiconductor device of claim 8, wherein the conductive strip routes through a turning corner.

10. The semiconductor device of claim 1, wherein the conductive strip is isolated from the first active region by an isolation layer.

11. A method of manufacturing a semiconductor device, comprising:

forming a transistor layer including a plurality of active regions for forming transistors;

forming a conductive strip extending from a first active region toward to a second active region for signal connection;

forming a dielectric layer on the transistor layer, wherein the dielectric layer includes the conductive strip; and forming a power grid structure arranged to direct a power source to the transistor layer from a bottom of the transistor layer;

wherein forming the transistor layer comprises:

forming a first cell including the first active region; and forming a second cell including the second active region;

and forming the conductive strip, on the first active region comprises:

forming the conductive strip extending across a boundary between the first cell and the second cell.

12. The method of claim 11, wherein forming the conductive strip, on the first active region further comprises:

forming the conductive strip connected between the first active region and the second active region.

13. The method of claim 12, wherein forming the conductive strip, on the first active region further comprises:

forming the conductive strip routing through a turning corner.

14. The method of claim 11, further comprising:

forming a plurality of metal strips on the dielectric layer, wherein the plurality of metal strips extends in a first direction for signal connection;

and forming the conductive strip, on the first active region comprises:

forming the conductive strip whose one end is connected to one of the plurality of metal strips for signal connection via a contact via.

15. The method of claim 14, wherein forming the conductive strip, on the first active region comprises:

forming the conductive strip routing through a turning corner.

16. A system, comprising:

a storage device, arranged to store a program code; and a processor, when executed and loaded by the processor, the program code instructs the processor to execute following operations:

forming a transistor layer including a plurality of active regions for forming transistors;

forming a conductive strip extending from a first active region toward to a second active region for signal connection;

forming a dielectric layer on the transistor layer, wherein the dielectric layer includes the conductive strip; and forming a power grid structure arranged to direct a power source to the transistor layer from a bottom of the transistor layer;

wherein forming the transistor layer-comprises:

forming a first cell including the first active region; and forming a second cell including the second active region;

and forming the conductive strip, on the first active region comprises:

forming the conductive strip extending across a boundary between the first cell and the second cell.

17. The system of claim 16, wherein forming the conductive strip, on the first active region further comprises:

forming the conductive strip connected between the first active region and the second active region.

18. The system of claim 17, wherein forming the conductive strip, on the first active region further comprises:

forming the conductive strip routing through a turning corner.

19. The system of claim 16, wherein the program code further instructs the processor to execute following operations:

forming a plurality of metal strips on the dielectric layer, wherein the plurality of metal strips extends in a first direction for signal connection;

and forming the conductive strip, on the first active region comprises:

forming the conductive strip whose one end is connected to one of the plurality of metal strips for signal connection via a contact via.

20. The system of claim 19, wherein forming the conductive strip, on the first active region comprises:

forming the conductive strip routing through a turning corner.

* * * * *